(12) United States Patent
Morikawa

(10) Patent No.: US 11,515,182 B2
(45) Date of Patent: Nov. 29, 2022

(54) DRYING APPARATUS, SUBSTRATE PROCESSING SYSTEM, AND DRYING METHOD

(71) Applicant: Tokyo Electron Limited, Tokyo (JP)

(72) Inventor: Katsuhiro Morikawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/875,129

(22) Filed: May 15, 2020

(65) Prior Publication Data

US 2020/0365425 A1 Nov. 19, 2020

(30) Foreign Application Priority Data

May 17, 2019 (JP) .............................. JP2019-093780

(51) Int. Cl.
*H01L 21/02* (2006.01)
*H01L 21/67* (2006.01)
(52) U.S. Cl.
CPC .... *H01L 21/6715* (2013.01); *H01L 21/02052* (2013.01); *H01L 21/02054* (2013.01); *H01L 21/67034* (2013.01); *H01L 21/67098* (2013.01); *H01L 21/67103* (2013.01); *H01L 21/67109* (2013.01); *H01L 21/67115* (2013.01)
(58) Field of Classification Search
CPC ......... H01L 21/67178; H01L 21/67034; H01L 21/67173; H01L 21/02052; H01L 21/67706; H01L 21/6776; H01L 21/67098–67115; H01L 21/67017–67034; H01L 21/6704; H01L 21/67051
See application file for complete search history.

(56) References Cited

U.S. PATENT DOCUMENTS 6,578,589 B1 * 6/2003 Mayusumi ........ H01L 21/67034
134/61
2014/0261566 A1 * 9/2014 Hayashi ............ H01L 21/67028
134/26
(Continued)

FOREIGN PATENT DOCUMENTS

JP 2008130951 A * 6/2008
JP 2014-90015 A 5/2014

*Primary Examiner* — Mikhail Kornakov
*Assistant Examiner* — Richard Z. Zhang
(74) *Attorney, Agent, or Firm* — Nath, Goldberg & Meyer; Jerald L. Meyer; Tanya E. Harkins

(57) ABSTRACT

There is provided a drying apparatus for covering an upper surface of the substrate with an uneven pattern formed thereon with a liquid film and subsequently drying the substrate, including: a first heat transfer part whose temperature is adjusted to a first temperature, wherein a first heat is transferred between the first heat transfer part and the substrate by a first temperature difference; a second heat transfer part whose temperature is adjusted to a second temperature different from the first temperature, wherein a second heat is transferred between the second heat transfer part and the substrate by a second temperature difference; and a controller configured to control the first temperature and the second temperature and to control a surface tension distribution of the liquid film so as to control an agglomeration of the liquid film.

17 Claims, 23 Drawing Sheets

(56) References Cited

U.S. PATENT DOCUMENTS

2015/0243542 A1* 8/2015 Yoshihara ......... H01L 21/67051
  156/345.15
2017/0051406 A1* 2/2017 Mori ....................... C23C 16/46
2019/0172732 A1* 6/2019 Naohara ............. H01L 21/6875

* cited by examiner

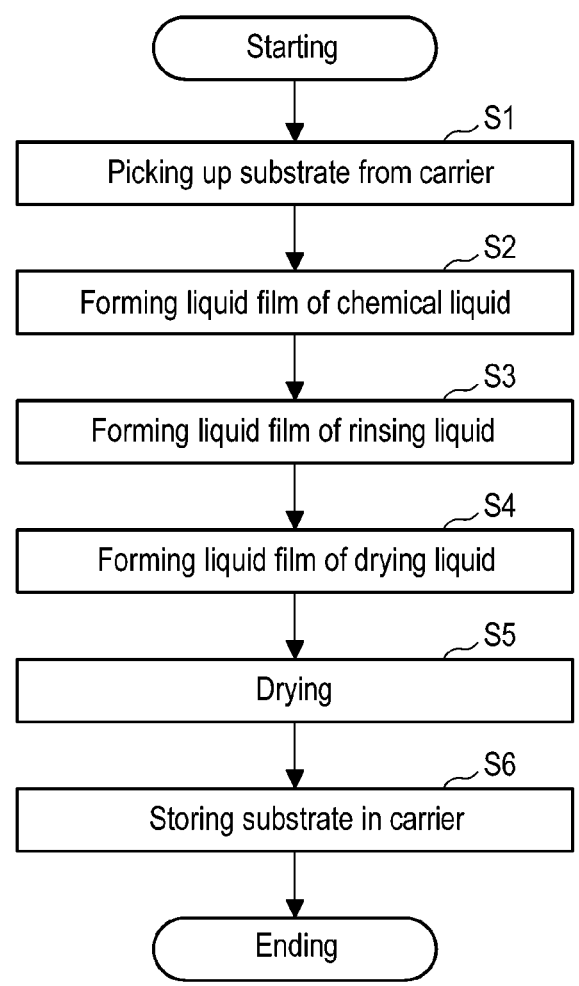

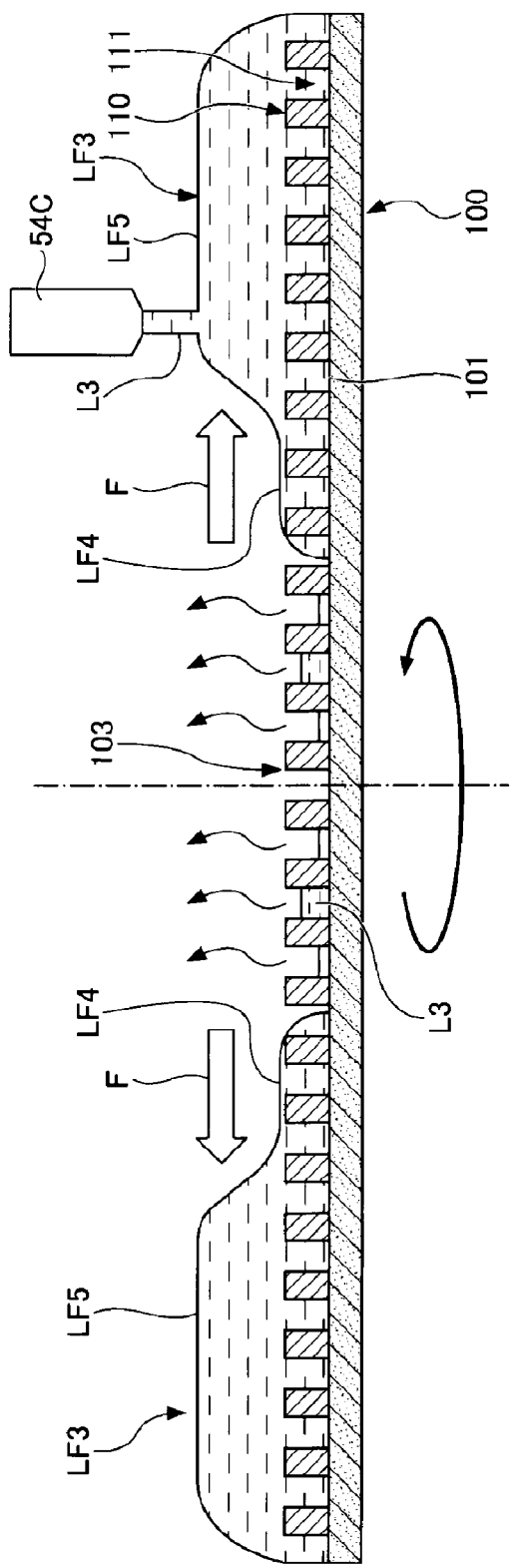

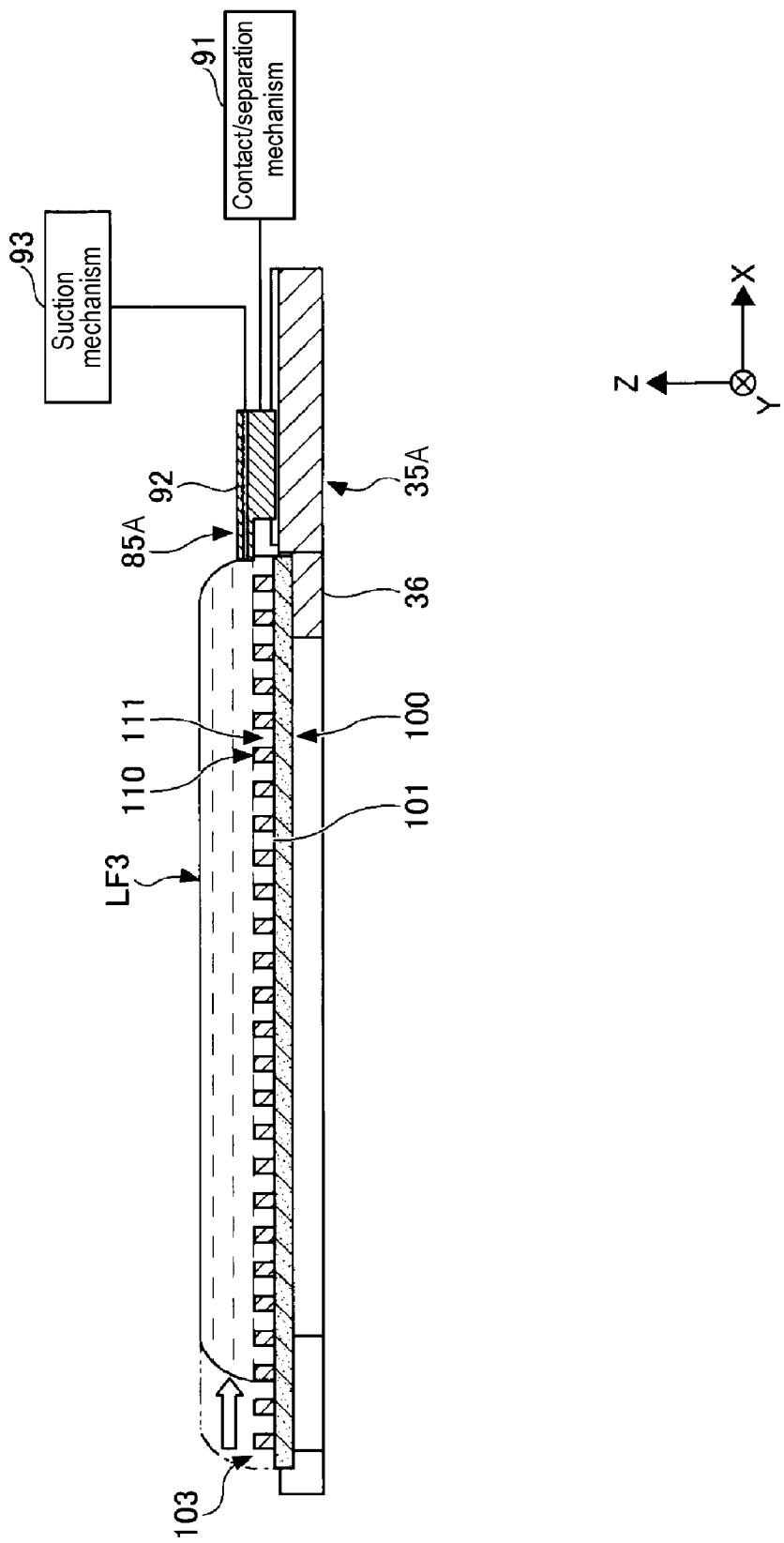

DRYING APPARATUS, SUBSTRATE PROCESSING SYSTEM, AND DRYING METHOD

CROSS-REFERENCE TO RELATED APPLICATION

This application is based upon and claims the benefit of priority from Japanese Patent Application No. 2019-093780, filed on May 17, 2019, the entire contents of which are incorporated herein by reference.

TECHNICAL FIELD

The present disclosure relates to a drying apparatus, a substrate processing system, and a drying method.

BACKGROUND

A liquid processing system disclosed in Patent Document 1 includes a liquid processing apparatus for supplying a processing liquid to a substrate to perform liquid processing, and a controller for controlling the liquid processing apparatus. The liquid processing apparatus includes a holder for holding the substrate, and a first supplier for supplying a volatile fluid to a surface of the substrate held by the holder. As the volatile fluid, for example, isopropyl alcohol (IPA) is used. The IPA is supplied to a pattern formation surface of the substrate. The controller causes the liquid processing apparatus to perform a volatile fluid supply process and an exposure process. The volatile fluid supply process is a process of supplying the volatile fluid from the first supplier to the surface of the substrate to form a liquid film on the surface of the substrate. The exposure process is a process of exposing the surface of the substrate from the volatile fluid. In the exposure process, the supply position of IPA is moved from the center of the substrate to the outer periphery of the substrate while rotating the substrate. Further, in the exposure process, the supply position of a nitrogen gas, which is set radially inward of the substrate with reference to the supply position of IPA, is moved from the center of the substrate to the outer periphery of the substrate while rotating the substrate.

PRIOR ART DOCUMENTS

Patent Documents

Patent Document 1: Japanese laid-open publication No. 2014-090015

SUMMARY

According to one embodiment of the present disclosure, there is provided a drying apparatus for covering an upper surface of the substrate with an uneven pattern formed thereon with a liquid film and subsequently drying the substrate, including: a first heat transfer part whose temperature is adjusted to a first temperature, wherein a first heat is transferred between the first heat transfer part and the substrate by a first temperature difference; a second heat transfer part whose temperature is adjusted to a second temperature different from the first temperature, wherein a second heat is transferred between the second heat transfer part and the substrate by a second temperature difference; and a controller configured to control the first temperature and the second temperature and to control a surface tension distribution of the liquid film so as to control an agglomeration of the liquid film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a flowchart illustrating a substrate processing method according to an embodiment of the present disclosure.

FIGS. 7A and 7B are cross-sectional views illustrating a drying process performed in the related art.

FIG. 14 is a cross-sectional view illustrating an exemplary modification of a liquid discharge mechanism.

DETAILED DESCRIPTION

Figure 1:
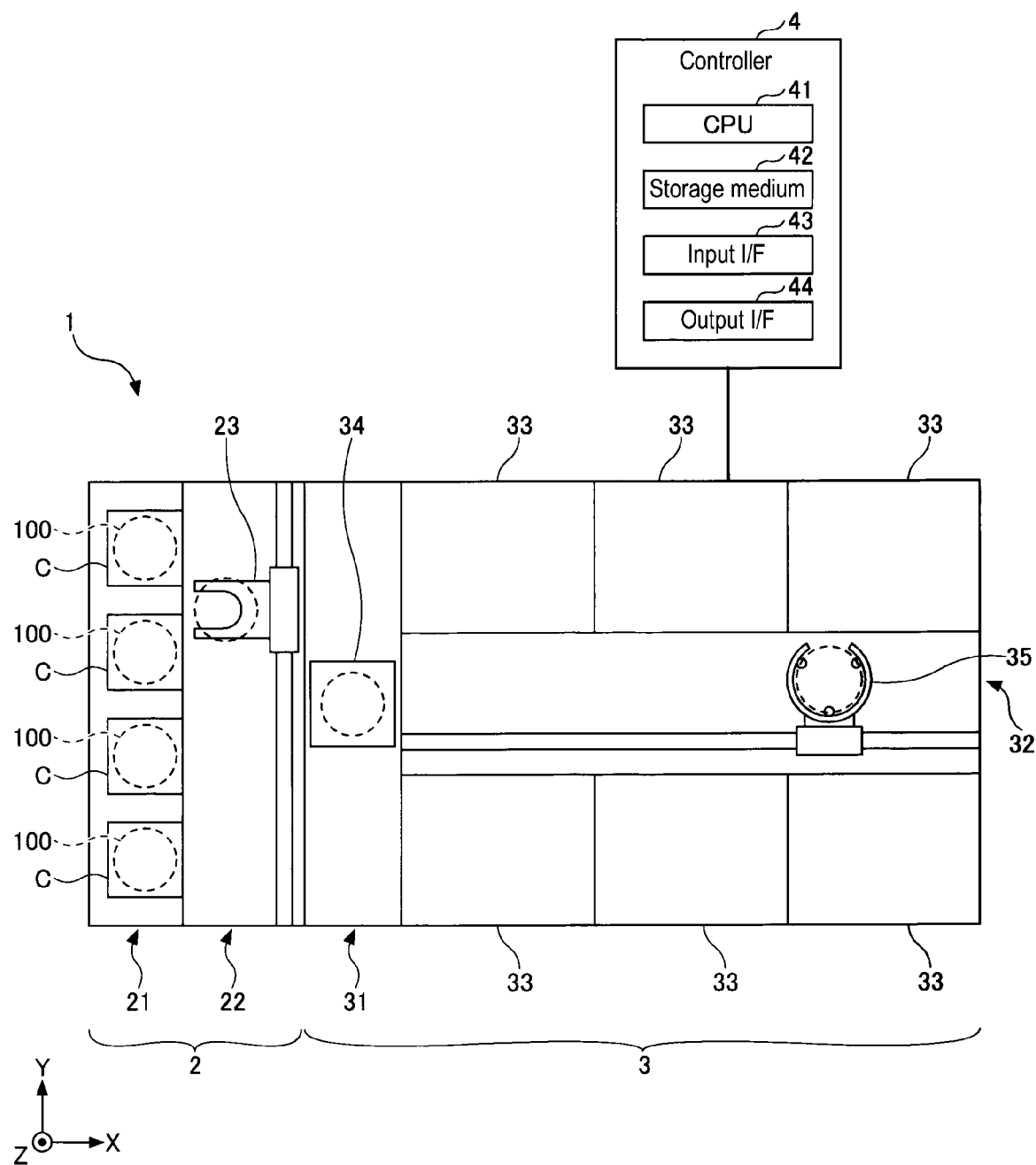
FIG. 1 is a plan view illustrating a substrate processing system according to an embodiment of the present disclosure.

Embodiments of the present disclosure will now be described with reference to the drawings. In the drawings, like or corresponding components are denoted by like reference numerals and thus a description thereof will be omitted. In the subject specification, an X-axis direction, a Y-axis direction, and a Z-axis direction are perpendicular to each another. The X-axis direction and the Y-axis direction are horizontal directions, and the Z-axis direction is a vertical direction. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
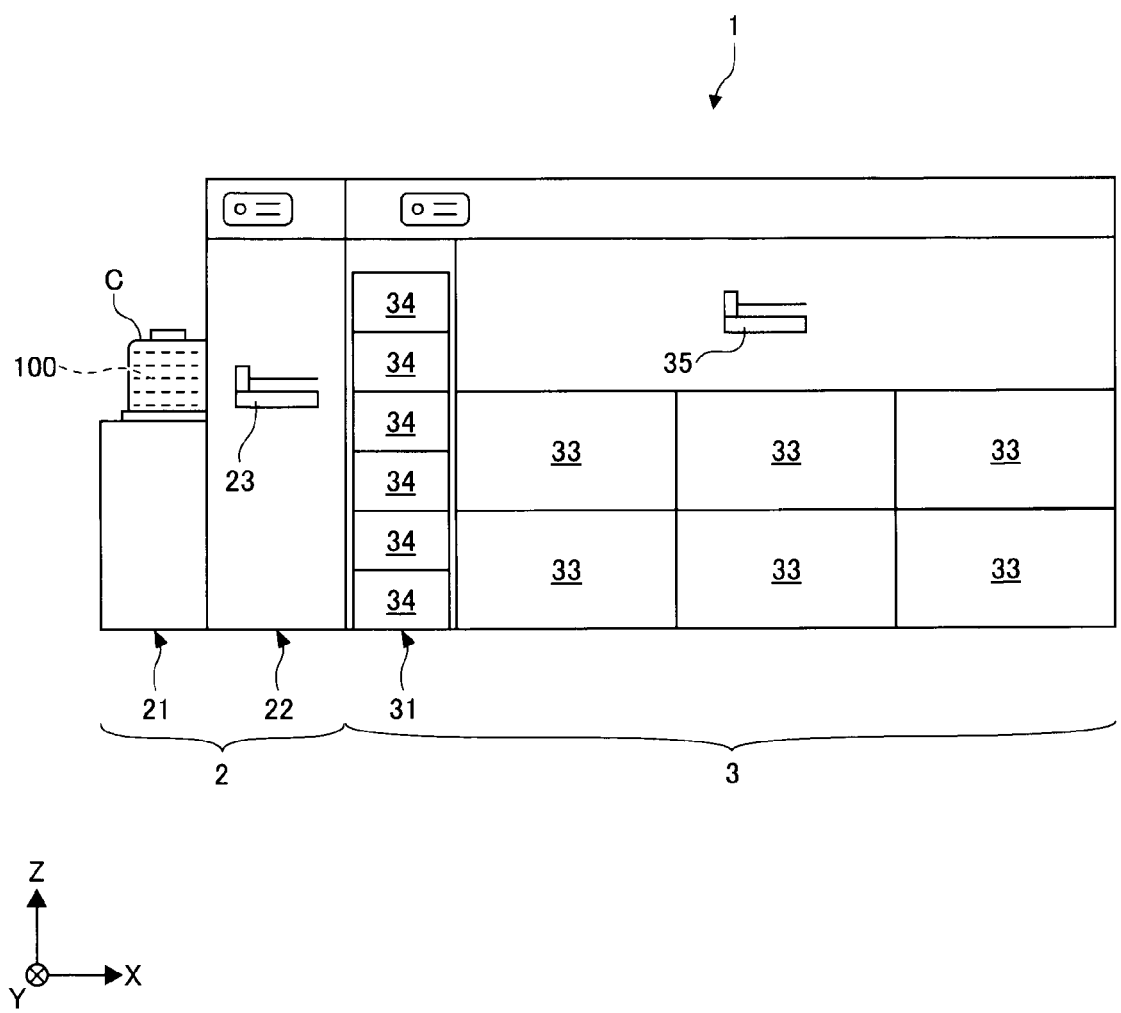
FIG. 2 is a side view illustrating the substrate processing system according to an embodiment of the present disclosure.

FIG. 1 is a plan view illustrating a substrate processing system according to an embodiment of the present disclosure. FIG. 2 is a side view illustrating the substrate processing system according to an embodiment of the present disclosure. A substrate processing system 1 performs liquid processing on substrates 100 and dries the substrates 100. The substrate processing system 1 includes a loading/unloading station 2 and a processing station 3. The loading/unloading station 2 and the processing station 3 are installed adjacent to each other.

The loading/unloading station 2 includes a placement part 21 and a first transfer part 22. A plurality of carriers C, which accommodate a plurality of substrates 100 in a horizontal posture, are placed on the placement part 21.

The first transfer part 22 is installed adjacent to the placement part 21, and includes a first transfer device 23 provided therein. The first transfer device 23 includes a holder for holding the substrate 100. The holder is configured to move in the horizontal and vertical directions and to rotate around the vertical axis thereof, and to transfer the substrate 100 between the carriers C and a delivery part 31.

The processing station 3 is installed adjacent to the first transfer part 22. The processing station 3 includes the delivery part 31, a second transfer part 32, and a plurality of liquid processing apparatuses 33. The plurality of liquid processing apparatuses 33 are installed to be arranged at both sides of the second transfer part 32.

The delivery part 31 is installed adjacent to both the first transfer part 22 and the second transfer part 32, and delivers the substrate 100 between the first transfer part 22 and the second transfer part 32. The delivery part 31 has a drying apparatus 34 provided therein. As illustrated in FIG. 2, a plurality of drying apparatuses 34 may be stacked one above another in the vertical direction. Thus, the installation area of the substrate processing system 1 can be reduced.

The second transfer part 32 includes a second transfer device 35 provided therein. The second transfer device 35 includes a holder for holding the substrate 100. The holder is configured to move in the horizontal and vertical directions and to rotate around the vertical axis thereof, and to transfer the substrate 100 between the delivery part 31 and the liquid processing apparatuses 33.

Each liquid processing apparatus 33 performs desired substrate processing on the substrate 100 transferred by the second transfer device 35.

In addition, the substrate processing system 1 includes a controller 4. The controller 4 is, for example, a computer, and includes a central processing unit (CPU) 41 and a storage medium 42 such as a memory or the like, as illustrated in FIG. 1. The storage medium 42 stores a program for controlling various processes to be executed in the substrate processing system 1. The controller 4 controls the operation of the substrate processing system 1 by causing the CPU 41 to execute the program stored in the storage medium 42. Furthermore, the controller 4 includes an input interface (I/F) 43 and an output interface (I/F) 44. The controller 4 receives an external signal at the input interface 43 and transmits a signal to the outside at the output interface 44.

The program is stored in, for example, a non-transitory computer-readable storage medium, and is installed on the storage medium 42 of the controller 4 from the respective storage medium. The computer-readable storage medium may include, for example, a hard disc (HD), a flexible disc (FD), a compact disc (CD), a magneto-optical disc (MO), a memory card, and the like. Furthermore, the program may be downloaded from a server via the Internet and installed on the storage medium 42 of the controller 4.

In the substrate processing system 1 described above, first, the first transfer device 23 of the loading/unloading station 2 picks up the substrate 100 from the carrier C placed on the placement part 21 and places the picked-up substrate 100 on the delivery part 31. The substrate 100 placed on the delivery part 31 is picked up from the delivery part 31 by the second transfer device 35 of the processing station 3 and loaded into the liquid processing apparatus 33.

The substrate 100 loaded into the liquid processing apparatus 33 is processed by the liquid processing apparatus 33. Thereafter, the processed substrate 100 is unloaded from the liquid processing apparatus 33 by the second transfer device 35 and is placed on the delivery part 31. Then, the processed substrate 100 placed on the delivery part 31 is returned to the carrier C of the placement part 21 by the first transfer device 23.

Figure 3:
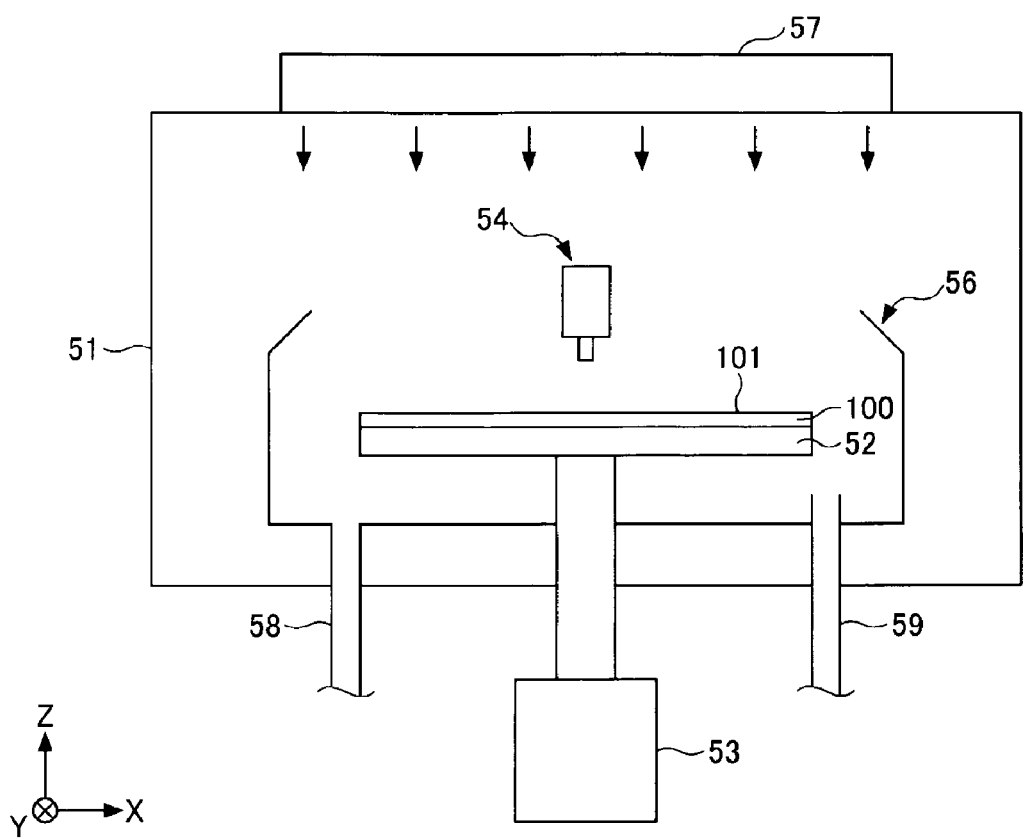
FIG. 3 is a cross-sectional view illustrating a liquid processing apparatus according to an embodiment of the present disclosure.
Figure 4:
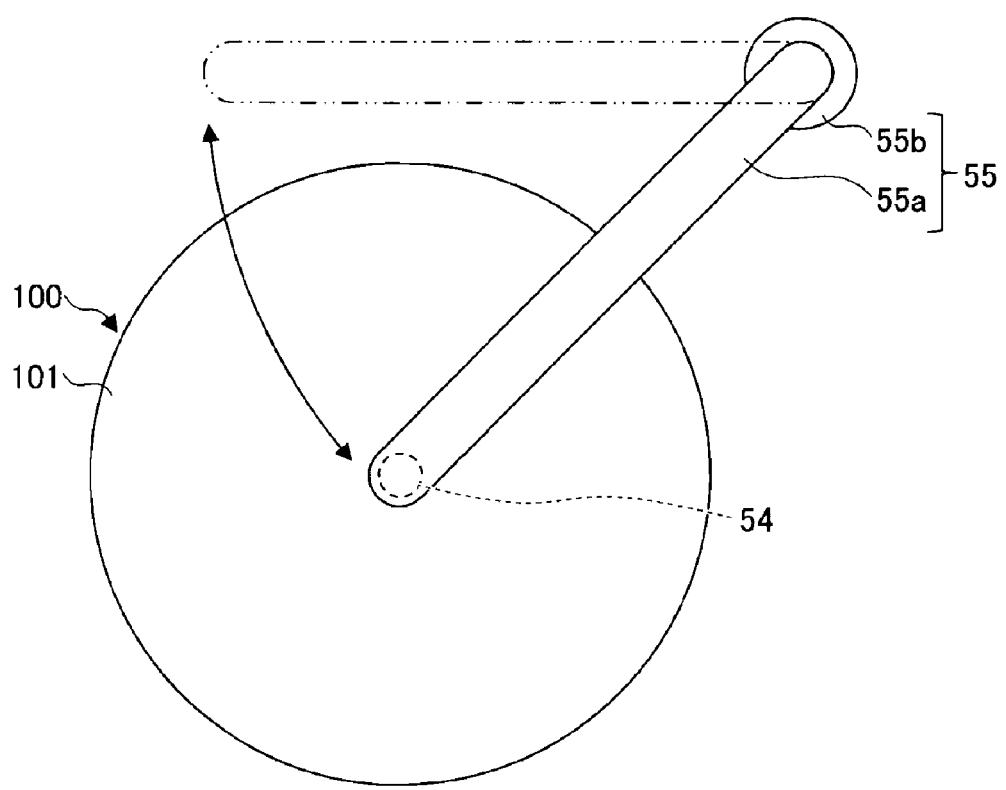
FIG. 4 is a plan view illustrating a nozzle moving mechanism according to an embodiment of the present disclosure.

FIG. 3 is a cross-sectional view illustrating the liquid processing apparatus according to an embodiment of the present disclosure. FIG. 4 is a plan view illustrating a nozzle moving mechanism according to an embodiment of the present disclosure. The liquid processing apparatus 33 includes, for example, a process vessel 51, a holder 52, a rotary motor 53, a nozzle 54, a nozzle moving mechanism 55, and a cup 56.

The process vessel 51 accommodates the holder 52, the nozzle 54, and the cup 56 therein. A fan filter unit (FFU) 57 is installed on a ceiling of the process vessel 51. The FFU 57 forms a down-flow inside the process vessel 51.

The holder 52 horizontally holds a substrate 100. The holder 52 is a mechanical chuck, a vacuum adsorption chuck, an electrostatic chuck, or the like.

The rotary motor 53 rotates the substrate 100 held by the holder 52 by rotating the holder 52. The holder 52 rotates around a vertical rotary shaft.

The nozzle 54 supplies a processing fluid to the substrate 100 held by the holder 52. The processing fluid may be either a liquid or a gas, or a mixed fluid of both. The number of nozzles 54 may be one or more.

Figure 6A:
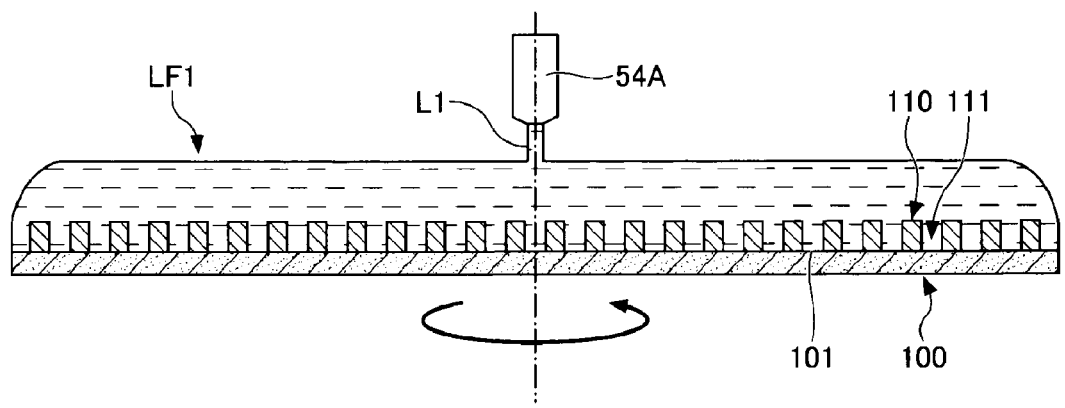
FIGS. 6A to 6C are cross-sectional views illustrating a process performed by the liquid processing apparatus according to an embodiment of the present disclosure.
Figure 6B:
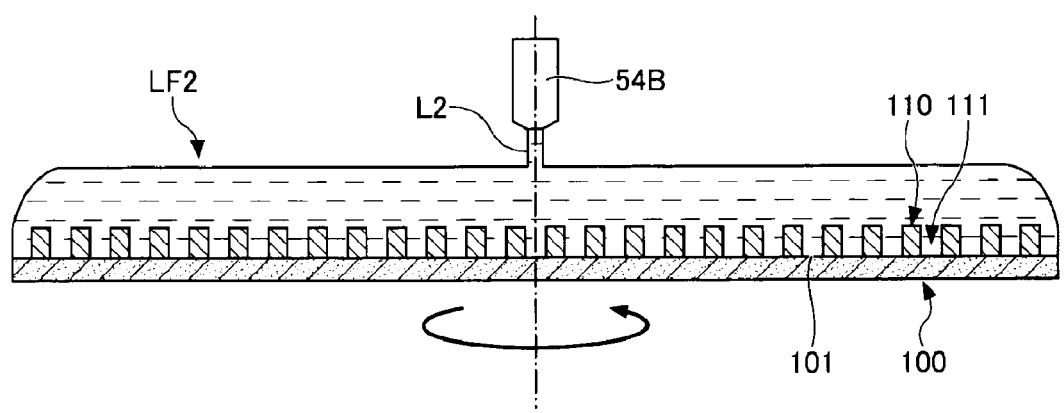
Figure 6C:
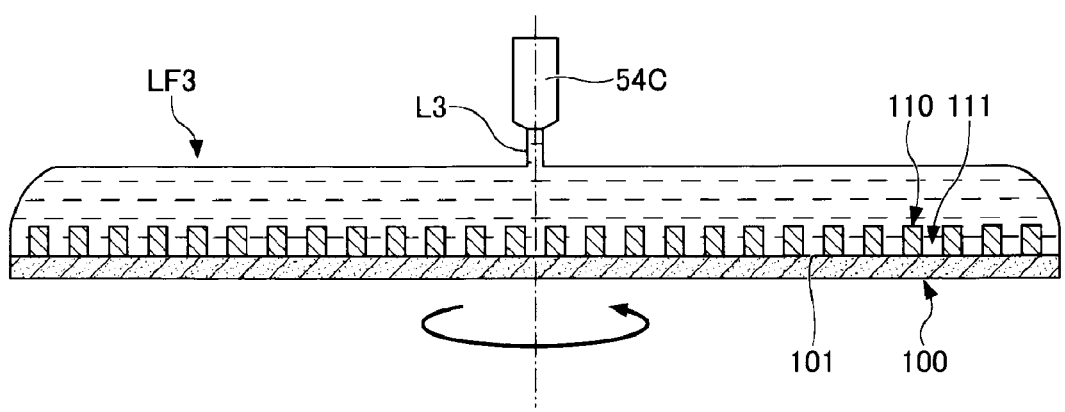

As the nozzle 54, for example, a chemical liquid discharge nozzle 54A illustrated in FIG. 6A, a rinsing liquid discharge nozzle 54B illustrated in FIG. 6B, and a drying liquid discharge nozzle 54C illustrated in FIG. 6C are installed.

The chemical liquid discharge nozzle 54A supplies a chemical liquid L1 to the center of the substrate 100 rotating together with the holder 52. The chemical liquid L1 spreads from the center of the substrate 100 to the outer periphery of the substrate 100 by virtue of a centrifugal force to form a liquid film LF1. The chemical liquid L1 is not particularly limited, but may be, for example, a dilute hydrofluoric acid (DHF).

Furthermore, the chemical liquid L1 may be a general one used for cleaning the semiconductor substrate and is not limited to DHF. For example, the chemical liquid L1 may be SC-1 (an aqueous solution containing ammonium hydroxide and hydrogen peroxide) or SC-2 (an aqueous solution containing hydrogen chloride and hydrogen peroxide). Different kinds of chemicals solutions L1 may be used.

The rinsing liquid discharge nozzle 54B supplies a rinsing liquid L2 to the center of the substrate 100 rotating together with the holder 52. The rinsing liquid L2 spreads from the center of the substrate 100 to the outer periphery of the substrate 100 by virtue of a centrifugal force, while replacing the chemical liquid L1, to form a liquid film LF2. The rinsing liquid L2 is not particularly limited, but may be, for example, water such as deionized water (DIW) or the like.

The drying liquid discharge nozzle 54C supplies a drying liquid L3 to the center of the substrate 100 rotating together with the holder 52. The drying liquid L3 spreads from the center of the substrate 100 to the outer periphery of the substrate 100 by virtue of a centrifugal force, while replacing the rinsing liquid L2, to form a liquid film LF3. The drying liquid L3 is not particularly limited, but may be, for example, an organic solvent such as isopropyl alcohol (IPA) or the like.

Furthermore, the drying liquid L3 is not limited to IPA. The drying liquid L3 may have surface tension lower than that of the rinsing liquid L2, and may be, for example, hydrofluoroether (HFE), methanol, ethanol, acetone, or trans-1,2-dichloroethylene.

The nozzle moving mechanism 55 moves the nozzle 54 in the radial direction of the substrate 100, as illustrated in FIG. 4. The nozzle moving mechanism 55 may move the plurality of nozzles 54 together, or may move the plurality of nozzles 54 independently.

The nozzle moving mechanism 55 has, for example, a swivel arm 55a for holding the nozzle 54 and a swiveling mechanism 55b for swiveling the swivel arm 55a. The swiveling mechanism 55b may also serve as a mechanism for moving the swivel arm 55a up and down.

The swivel arm 55a is horizontally arranged, and holds the nozzle 54 at its leading end. The swiveling mechanism 55b swivels the swivel arm 55a around a rotary shaft extending downward from a base end of the swivel arm 55a. The swivel arm 55a swings between a position indicated by a solid line in FIG. 4 and a position indicated by a two-dot chain line in FIG. 4.

In addition, the nozzle moving mechanism 55 may have a guide rail and a linear motion mechanism, instead of the swivel arm 55a and the swiveling mechanism 55b. The guide rail is horizontally arranged and the linear motion mechanism moves the nozzle 54 along the guide rail.

The cup 56 is arranged so as to surround the holder 52, as illustrated in FIG. 3, and collects the liquid scattering from the substrate 100 with the rotation of the holder 52. A liquid drain pipe 58 and an exhaust pipe 59 are installed at the bottom of the cup 56. The liquid drain pipe 58 drains the liquid inside the cup 56, and the exhaust pipe 59 discharges the gas in the cup 56.

FIG. 5 is a flowchart illustrating a substrate processing method according to an embodiment of the present disclosure. A process illustrated in FIG. 5 is performed under the control of the controller 4, and is repeatedly performed while changing the substrate 100. FIGS. 6A to 6C are cross-sectional views illustrating a process performed by the liquid processing apparatus according to an embodiment of the present disclosure, in which FIG. 6A is a cross-sectional view illustrating a liquid film of a chemical liquid in an embodiment of the present disclosure, FIG. 6B is a cross-sectional view illustrating a liquid film of a rinsing liquid in an embodiment of the present disclosure, and FIG. 6C is a cross-sectional view illustrating a liquid film of a drying liquid in an embodiment of the present disclosure.

First, the first transfer device 23 of the loading/unloading station 2 picks up an unprocessed substrate 100 from the carrier C (S1). Subsequently, the first transfer device 23 places the substrate 100 on the delivery part 31. Thereafter, the second transfer device 35 of the processing station 3 receives the substrate 100 from the delivery part 31 and transfers the same to the liquid processing apparatus 33.

The liquid processing apparatus 33 horizontally holds the substrate 100 by the holder 52. An uneven pattern 110 is formed in an upper surface 101 of the substrate 100 in advance. The uneven pattern 110 is formed by, for example, a photolithography method, an etching method, and the like. The uneven pattern 110 is formed by, for example, etching a film (e.g., a silicon nitride film) formed on the substrate 100.

Subsequently, the liquid processing apparatus 33 supplies the chemical liquid L1 to the upper surface 101 of the substrate 100 to form the liquid film LF1 of the chemical liquid L1 covering the upper surface 101 of the substrate 100 (S2). As illustrated in FIG. 6A, the chemical liquid discharge nozzle 54A is arranged directly above the center of the substrate 100. The chemical liquid discharge nozzle 54A supplies the chemical liquid L1 from above to the center of the substrate 100 rotating together with the holder 52. The supplied chemical liquid L1 spreads over the entire upper surface 101 of the substrate 100 by virtue of a centrifugal force to form the liquid film LF1. In order to clean the entire uneven pattern 110, the number of rotations of the holder 52 and the supply flow rate of the chemical liquid L1 are set such that a liquid level height of the liquid film LF1 is higher than a height of an upper end of the uneven pattern 110.

Subsequently, the liquid processing apparatus 33 forms the liquid film LF2 by replacing the previously-formed liquid film LF1 of the chemical liquid L1 by the liquid film LF2 of the rinsing liquid L2 (S3). As illustrated in FIG. 6B, instead of the chemical liquid discharge nozzle 54A, the rinsing liquid discharge nozzle 54B is arranged directly above the center of the substrate 100. The discharge of the chemical liquid L1 from the chemical liquid discharge nozzle 54A is stopped, and the discharge of the rinsing liquid L2 from the rinsing liquid discharge nozzle 54B begins. The rinsing liquid L2 is supplied to the center of the substrate 100 rotating together with the holder 52 to spread over the entire upper surface 101 of the substrate 100 by virtue of a centrifugal force, so as to form the liquid film LF2. Thus, the chemical liquid L1 remaining on the uneven pattern 110 is replaced by the rinsing liquid L2. The number of rotations of the holder 52 and the supply flow rate of the rinsing liquid L2 are set such that a liquid level height of the liquid film LF2 is kept higher than a height of the upper end of the uneven pattern 110 during the replacement of the chemical liquid L1 by the rinsing liquid L2. Since the uneven pattern 110 is not exposed, it is possible to suppress pattern collapse due to a surface tension of the liquid surface.

Subsequently, the liquid processing apparatus 33 forms the liquid film LF3 by replacing the previously-formed liquid film LF2 of the rinsing liquid L2 by the liquid film LF3 of the drying liquid L3 (S4). As illustrated in FIG. 6C, instead of the rinsing liquid discharge nozzle 54B, the drying liquid discharge nozzle 54C is arranged directly above the center of the substrate 100. The discharge of the rinsing liquid L2 from the rinsing liquid discharge nozzle 54B is stopped, and the discharge of the drying liquid L3 from the drying liquid discharge nozzle 54C begins. The drying liquid L3 is supplied to the center of the substrate 100 rotating together with the holder 52 to spread over the entire upper surface 101 of the substrate 100 by virtue of a centrifugal force, so as to form the liquid film LF3. Thus, the rinsing liquid L2 remaining on the uneven pattern 110 is replaced by the drying liquid L3. The number of rotations of the holder 52 and the supply flow rate of the drying liquid L3 are set such that a liquid level height of the liquid film LF3 is kept higher than a height of the upper end of the uneven pattern 110 during the replacement of the rinsing liquid L2 by the drying liquid L3. Since the uneven pattern 110 is not exposed, it is possible to suppress the pattern collapse due to a surface tension of the liquid surface.

Thereafter, the holder 52 of the liquid processing apparatus 33 releases the substrate 100. Subsequently, the second transfer device 35 of the processing station 3 receives the substrate 100 from the liquid processing apparatus 33 and transfers the same to the drying apparatus 34 of the delivery part 31. During this period, the upper surface 101 of the substrate 100 is covered with the liquid film LF3 of the drying liquid L3.

The drying apparatus 34 dries the substrate 100 by exposing the upper surface 101 of the substrate 100 from the liquid film LF3 of the drying liquid L3 (S5). The drying liquid L3 has a surface tension smaller than that of the rinsing liquid L2. After replacing the liquid film LF2 of the rinsing liquid L2 by the liquid film LF3 of the drying liquid L3 and covering the upper surface 101 of the substrate 100 with the liquid film LF3, the upper surface 101 of the substrate 100 is exposed from the liquid film LF3. As a result, it is possible to suppress the pattern collapse due to the surface tension, compared with the case where the upper surface 101 of the substrate 100 is exposed from the liquid film LF2 of the rinsing liquid L2.

Thereafter, the first transfer device 23 of the loading/unloading station 2 receives the dried substrate 100 from the drying apparatus 34 and stores the same in the carrier C (S6).

Figure 7A:
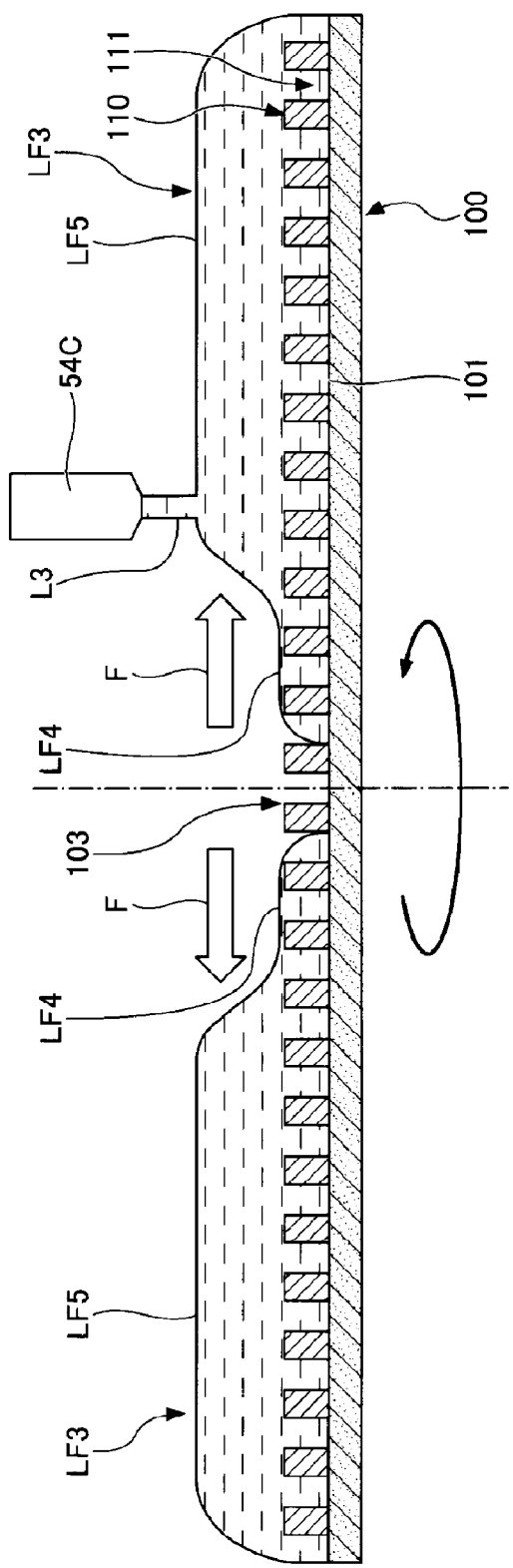

Hereinafter, the drying process (S5) of the present embodiment will be described. Prior to this description, a drying process in the related art will be described with reference to FIGS. 7A and 7B. FIGS. 7A and 7B are cross-sectional views illustrating the drying process in the related art, in which FIG. 7A is a cross-sectional view illustrating a liquid film LF3 at the start of drying process according to the related art, and FIG. 7B is a cross-sectional view illustrating the liquid film LF3 during the drying process according to the related art.

In the drying process (S5) of the related art, the supply position of the drying liquid L3 is shifted from the center of the substrate 100 toward the outer periphery of the substrate 100 while rotating the substrate 100 together with the holder 52. Since the substrate 100 is rotated, a centrifugal force is generated to push so that the liquid film LF3 radially outward of the substrate 100.

First, as illustrated in FIG. 7A, the liquid film LF3 is modified from a disc shape into a doughnut shape by the centrifugal force so that an exposed surface 103 is formed at the center of the upper surface 101 of the substrate 100. The exposed surface 103 is formed concentrically with the substrate 100.

Subsequently, as illustrated in FIG. 7B, the exposed surface 103 of the substrate 100 spreads from the center of the substrate 100 toward the outer periphery of the substrate 100 by virtue of the centrifugal force. Thereafter, the entire upper surface 101 of the substrate 100 is exposed from the liquid film LF3.

Furthermore, in the drying process (S5) of the related art, the supply position of a gas such as a nitrogen gas or the like is moved so as to follow the supply position of the drying liquid L3. The supply position of the gas is set radially inward of the supply position of the drying liquid L3. When the gas is brought into contact with the upper surface 101 of the substrate 100, the gas flows horizontally along the upper surface 101 of the substrate 100 and pushes an inner peripheral surface of the doughnut-like liquid film LF3 radially outward.

As described above, in the drying process (S5) of the related art, a force pushing the liquid film LF3 is used to enlarge the exposed surface 103 of the substrate 100. The used force is a laterally-biased external force F such as a centrifugal force, a wind pressure and the like. The external force F acts on the liquid film LF3 from the outside of the liquid film LF3.

As illustrated in FIGS. 7A and 7B, the external force F causes a thin film LF4 having a relatively low liquid level height near the outer periphery of the exposed surface 103 of the substrate 100. The thin film LF4 will also be referred to as a boundary layer. The thin film LF4 is generated between a thick film LF5 having a liquid level height higher than the thin film LF4 and the exposed surface 103 of the substrate 100.

After the thin film LF4 is generated, when the thick film LF5 flows in the lateral direction by the external force F, the drying liquid L3 is likely to remain in recesses 111 of the uneven pattern 110. The drying liquid L3 remaining in the recesses 111 is not discharged from the recesses 111 by the external force F, but is discharged from the recesses 111 by evaporation.

A difference in evaporation speed of the drying liquid L3 may occur between a plurality of adjacent recesses 111. As a result, a difference in liquid level height of the drying liquid L3 occurs as illustrated in FIG. 7B. The difference in liquid level height of the drying liquid L3 causes pattern collapse due to the surface tension.

Figure 8:
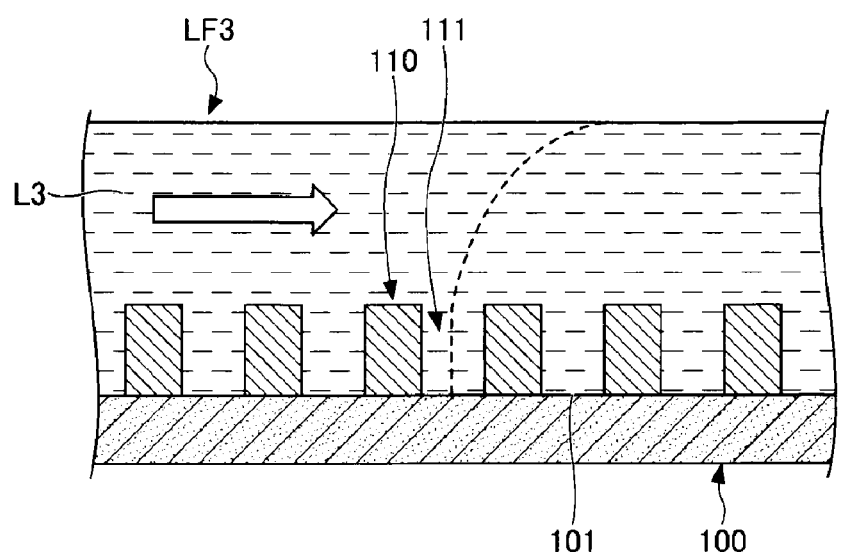
FIG. 8 is a cross-sectional view illustrating a drying process according to an embodiment of the present disclosure.

Subsequently, the drying process (S5) of the present embodiment will be described with reference to FIG. 8. FIG. 8 is a cross-sectional view illustrating the drying process according to an embodiment of the present disclosure.

In the drying process (S5) of the present embodiment, a temperature difference is generated in the liquid film LF3 to generate a surface tension difference, which will be described in detail later. In general, when the liquid composition of a liquid is equal, the higher the temperature of the liquid, the smaller the surface tension of the liquid.

Portions with large surface tension attract portions with small surface tension. The attracting force will be referred to as a Marangoni force. As a result, as indicated by an arrow in FIG. 8, the drying liquid L3 agglomerates. The state of the liquid film LF3 after agglomeration is indicated by a broken line in FIG. 8.

In the drying process (S5) of the present embodiment, the Marangoni force is used instead of the external force F. Since the Marangoni force is the force of the drying liquid L3 itself, the thin film LF4 (see FIGS. 7A and 7B) referred to as the boundary layer is not generated. As a result, the drying liquid L3 can be suppressed from remaining in the recesses 111 of the uneven pattern 110. Therefore, it is possible to suppress occurrence of a difference in liquid level height of the remaining drying liquid L3 between the plurality of adjacent recesses 111. Thus, it is possible to suppress the pattern collapse due to the surface tension.

Furthermore, in the drying process (S5) of the present embodiment, since the external force F is not used, the rotation of the substrate 100 and the supply of the gas to the upper surface 101 of the substrate 100 are not performed. However, the rotation of the substrate 100 and the like may be performed as long as the generation of the thin film LF4 can be suppressed. For example, the rotation of the substrate 100 may be performed at a low speed.

Figure 9A:
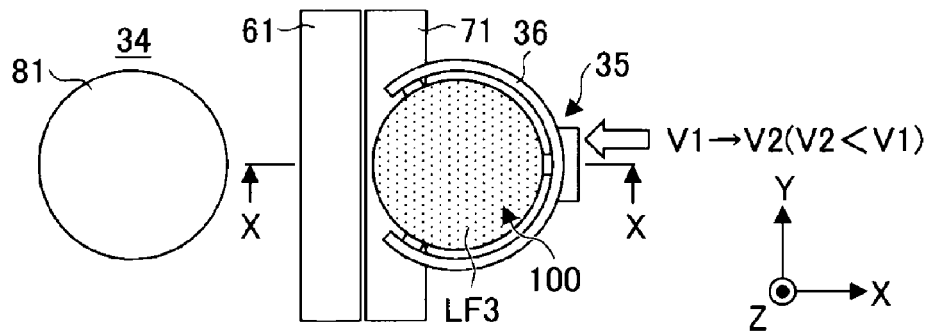
FIGS. 9A to 9E are plan views illustrating a drying apparatus according to an embodiment of the present disclosure.
Figure 9B:
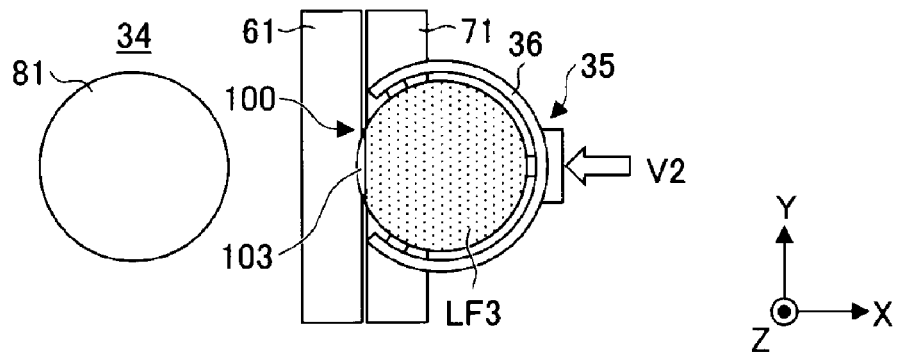
Figure 9C:
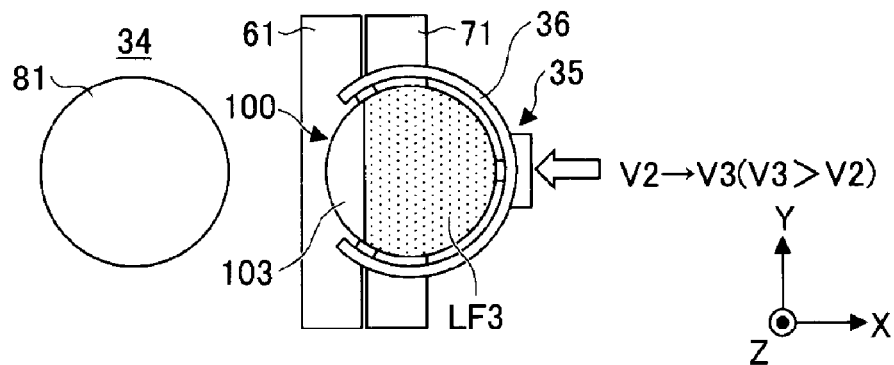
Figure 9D:
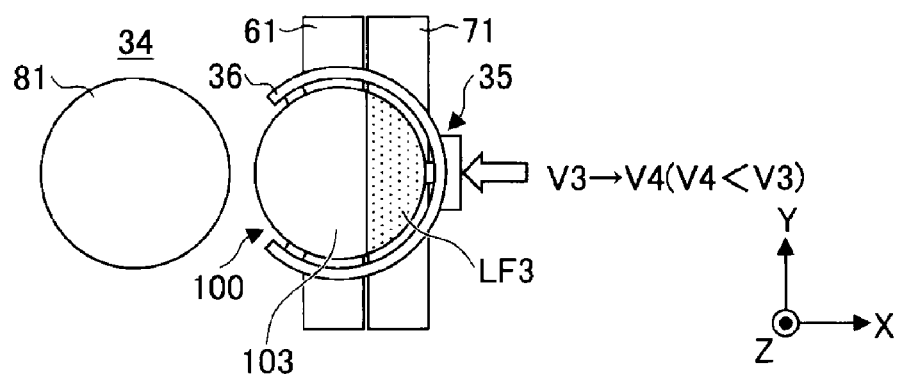
Figure 9E:
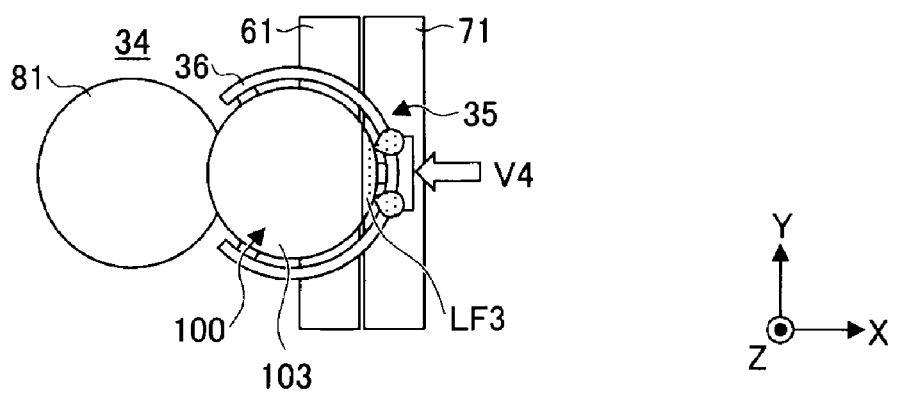
Figure 10:
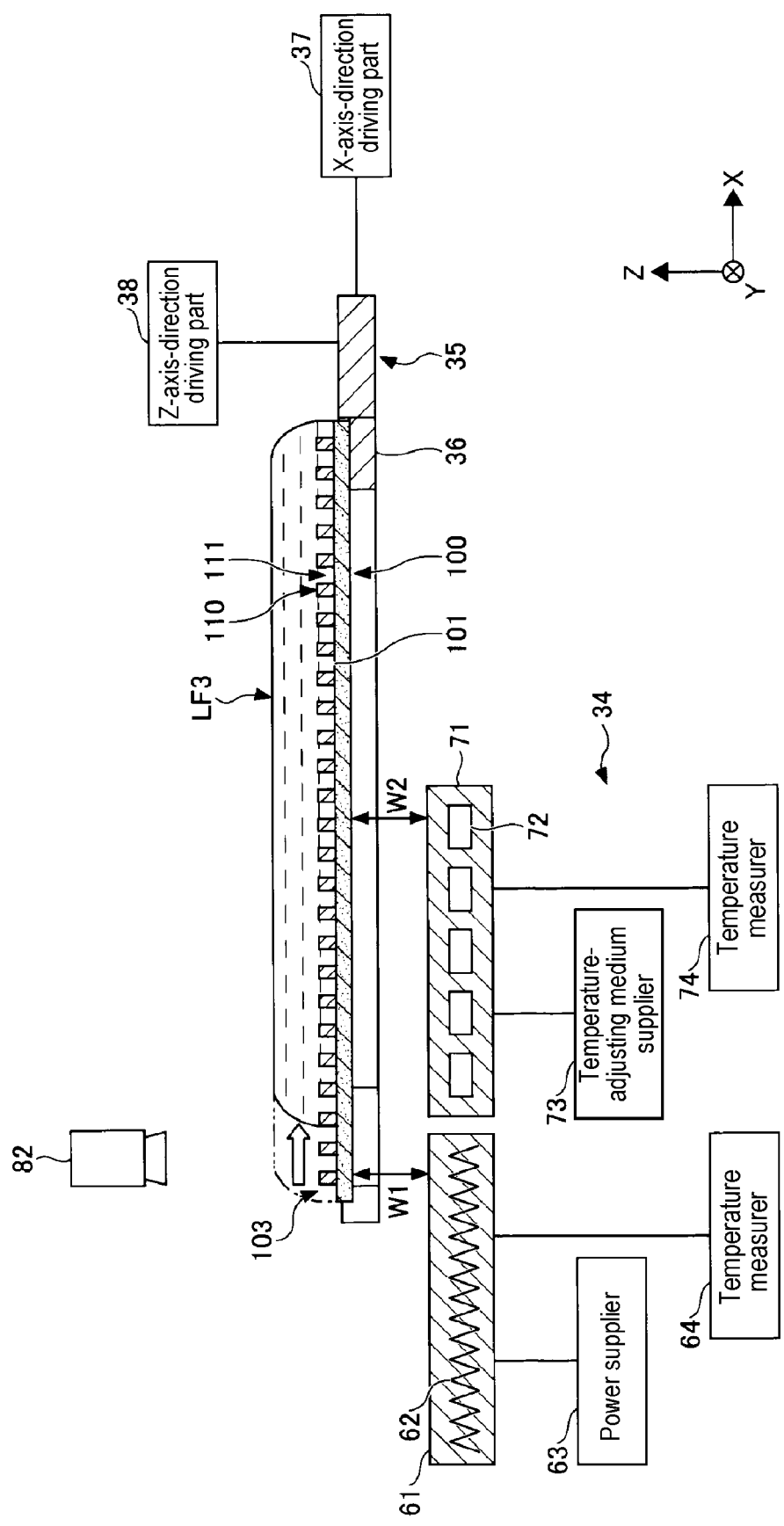
FIG. 10 is a cross-sectional view of the drying apparatus illustrated in FIGS. 9A to 9E and taken along line X-X in FIG. 9A.

FIGS. 9A to 9E are plan views illustrating the drying apparatus according to an embodiment of the present disclosure, in which FIG. 9A is a plan view illustrating a first stage of the drying process, FIG. 9B is a plan view illustrating a second stage of the drying process following FIG. 9A, FIG. 9C is a plan view illustrating a third stage of the drying process following FIG. 9B, FIG. 9D is a plan view illustrating a fourth stage of the drying process following FIG. 9C, and FIG. 9E is a plan view illustrating a fifth stage of the drying process following FIG. 9D. In FIGS. 9A to 9E, the liquid film LF3 is represented by a dot pattern. FIG. 10 is a cross-sectional view of the drying apparatus illustrated in FIGS. 9A to 9E and taken along line X-X in FIG. 9A. In FIGS. 9A to 9E, illustrations of an X-axis-direction driving part 37, a Z-axis-direction driving part 38, a power supplier 63, a temperature-adjusting medium supplier 73, an imaging part 82, and the like shown in FIG. 10 are omitted.

The drying apparatus 34 dries the substrate 100 by exposing the upper surface 101 of the substrate 100 from the liquid film LF3 of the drying liquid L3. The exposed surface 103 of the upper surface 101 of the substrate 100, which is exposed from the liquid film LF3, is enlarged. A direction in which the exposed surface 103 is enlarged in a plan view is, for example, the X-axis direction. The drying apparatus 34 has a first heat transfer part 61 and a second heat transfer part 71.

A temperature of the first heat transfer part 61 is adjusted to a first temperature T1 and transfers heat to and from the substrate 100 by a temperature difference. Heat generally flows from a high-temperature object to a low-temperature object. The first heat transfer part 61 is formed in, for example, a plate shape, and is horizontally arranged. Although the first heat transfer part 61 is arranged below the substrate 100 in FIGS. 9A to 9E, it may be arranged above the substrate 100. An air layer for transferring heat is formed between the first heat transfer part 61 and the substrate 100.

The first heat transfer part 61 has, for example, a rectangular shape in a plan view. A pair of sides are parallel to the X-axis direction, and the other pair of sides are parallel to the Y-axis direction. The dimension of the first heat transfer part 61 in a direction (for example, the Y-axis direction) orthogonal to a direction in which the exposed surface 103 is enlarged in a plan view (for example, the X-axis direction) is larger than a diameter of the substrate 100.

The first heat transfer part 61 is, for example, a heating plate for heating the substrate 100. The first temperature T1 is set higher than room temperature. In this case, the drying apparatus 34 includes, for example, a heater 62 for heating the first heat transfer part 61 and a power supplier 63 for supplying electric power to the heater 62. Although the heater 62 is buried in the first heat transfer part 61 in FIGS. 9A to 9E, it may be installed outside the first heat transfer part 61. The power supplier 63 includes a power source and a power regulator for regulating the electric power supplied from the power source to the heater 62. The controller 4 controls the electric power to be supplied to the heater 62 so as to control the temperature of the first heat transfer part 61 to the first temperature T1. The drying apparatus 34 may further include a temperature measurer 64 for measuring the temperature of the first heat transfer part 61. The controller 4 controls the electric power to be supplied to the heater 62 so that the measured value of the temperature measurer 64 becomes equal to the first temperature T1.

A temperature of the second heat transfer part 71 is adjusted to a second temperature T2 different from the first temperature T1, and transfers heat to and from the substrate 100 by a temperature difference. The second heat transfer part 71 is formed in, for example, a plate shape, and is horizontally arranged. Although the second heat transfer part 71 is arranged below the substrate 100 in FIGS. 9A to 9E, it may be arranged above the substrate 100. An air layer for transferring heat is formed between the second heat transfer part 71 and the substrate 100.

The second heat transfer part 71 has, for example, a rectangular shape in a plan view. A pair of sides are parallel to the X-axis direction, and the other pair of sides are parallel to the Y-axis direction. The dimension of the second heat transfer part 71 in the direction (for example, the Y-axis direction) orthogonal to the direction in which the exposed surface 103 is enlarged in a plan view (for example, the X-axis direction) is larger than the diameter of the substrate 100.

The second heat transfer part 71 is, for example, a cooling plate for cooling the substrate 100. The second temperature T2 is set lower than room temperature. In this case, the drying apparatus 34 includes, for example, a temperature-adjusting medium supplier 73 for supplying a temperature-adjusting medium to a flow passage 72 formed inside the second heat transfer part 71. The temperature-adjusting medium supplier 73 includes, for example, a pump for forcibly feeding the temperature-adjusting medium and a temperature adjuster for adjusting a temperature of the temperature-adjusting medium. The controller 4 controls a flow rate and temperature of the temperature-adjusting medium so as to control the temperature of the second heat transfer part 71 to the second temperature T2. The drying apparatus 34 may further include a temperature measurer 74 for measuring the temperature of the second heat transfer part 71. The controller 4 controls a flow rate and the temperature of the temperature-adjusting medium so that the measured value of the temperature measurer 74 becomes equal to the second temperature T2. The temperature of the temperature-adjusting medium is set lower than room temperature.

However, the second temperature T2 may be lower than the first temperature T1, and may be higher than room temperature. Therefore, the second heat transfer part 71 may be a heating plate. In this case, the temperature of the temperature-adjusting medium is set higher than room temperature.

Furthermore, the second temperature T2 may be lower than the first temperature T1, and may be room temperature. Therefore, the second heat transfer part 71 may be a room-temperature plate. In this case, the temperature of the temperature-adjusting medium is set at room temperature.

The first heat transfer part 61 and the second heat transfer part 71 are arranged in the direction in which the exposed surface 103 is enlarged in a plan view (for example, in the X-axis direction). A gap may be formed between the first heat transfer part 61 and the second heat transfer part 71 in order to suppress heat transfer.

The first heat transfer part 61 and the second heat transfer part 71 causes a temperature difference in the liquid film LF3. The temperature difference of the liquid film LF3 occurs at a position overlapping a boundary line between the first heat transfer part 61 and the second heat transfer part 71 or at a position separated from the boundary line by a certain distance in a plan view. The controller 4 controls the first temperature T1 and the second temperature T2 and controls a surface tension distribution of the liquid film LF3 so as to control the agglomeration of the liquid film LF3.

The second temperature T2 is lower than the first temperature T1, and the second heat transfer part 71 and the first heat transfer part 61 are sequentially arranged side by side in the direction in which the substrate 100 is loaded into the drying apparatus 34. Therefore, the substrate 100 can be dried in the course of loading the substrate 100 into the delivery part 31 by the second transfer device 35. Since the transfer of the substrate 100 and the drying of the substrate 100 are simultaneously performed, multiple processes can be simultaneously performed, thereby shortening the processing time.

The drying apparatus 34 has a delivery holder 81 for holding the substrate 100. The drying apparatus 34 dries the substrate 100 before the delivery holder 81 receives the substrate 100 from the second transfer device 35. The delivery holder 81 holds the dried substrate 100 and transfers the dried substrate 100 to the first transfer device 23 of the loading/unloading station 2.

The second transfer device 35 of the processing station 3 has a transfer holder 36, which holds the substrate 100 horizontally. The transfer holder 36 has, for example, a U-shaped portion and a plurality of claws protruding inward from the U-shaped portion. The U-shaped portion is larger than the substrate 100, and the substrate 100 is placed on the plurality of claws. The U-shaped part presses the substrate 100 from the outside in the radial direction. The plurality of claws are arranged at intervals in the circumferential direction of the substrate 100. Furthermore, a U-shaped portion slightly smaller than the U-shaped portion may be used, instead of the plurality of claws. The transfer holder 36 is movable in the horizontal direction (for example, both the X-axis direction and the Y-axis direction) and the vertical direction (for example, the Z-axis direction), and is swingable around the vertical axis thereof.

The second transfer device 35 has an X-axis-direction driving part 37 which moves the transfer holder 36 in the X-axis direction. The X-axis-direction driving part 37 is an example of a horizontal-direction driving part for relatively moving the transfer holder 36 in the horizontal direction relative to the first heat transfer part 61 and the second heat transfer part 71. The X-axis-direction driving part 37 moves the transfer holder 36 in the X-axis direction so that the substrate 100 sequentially passes through the second heat transfer part 71 and the first heat transfer part 61 and reaches the delivery holder 81 in a plan view.

First, as illustrated in FIG. 9A, the controller 4 reduces the movement speed of the transfer holder 36 from the first speed V1 to the second speed V2 before a front end of the substrate 100 passes through the boundary between the second heat transfer part 71 and the first heat transfer part 61 in a plan view.

Subsequently, as illustrated in FIG. 9B, the front end of the substrate 100 passes through the boundary between the second heat transfer part 71 and the first heat transfer part 61 at the second speed V2 in a plan view. As a result, a temperature difference is generated in the liquid film LF3 to generate a surface tension difference, so that the exposed surface 103 is formed at the front end of the substrate 100 by virtue of a Marangoni force. The second speed V2 is set such that no droplet remains on the exposed surface 103.

Subsequently, as illustrated in FIG. 9C, the controller 4 further moves the substrate 100 forward, and further enlarges the exposed surface 103 of the substrate 100. Since the overlap between the substrate 100 and the first heat transfer part 61 is increased, heat is easily transferred between the substrate 100 and the first heat transfer part 61 and the Marangoni force is easily generated. Therefore, the controller 4 increases the movement speed of the transfer holder 36 from the second speed V2 to a third speed V3 in order to shorten the time required for drying.

Subsequently, as illustrated in FIG. 9D, the substrate 100 moves further forward so that the exposed surface 103 of the substrate 100 is further enlarged. Then, the liquid film LF3 agglomerates and the height of the liquid film LF3 grows higher, so that the liquid film LF3 is at a state immediately before being dropped from the substrate 100. Before the liquid film LF3 collapses, the controller 4 reduces the movement speed of the transfer holder 36 from the third speed V3 to a fourth speed V4.

Thereafter, as illustrated in FIG. 9E, the substrate 100 moves forward at the fourth speed V4 and the exposed surface 103 of the substrate 100 is further enlarged. Then, the speed of the substrate 100 at which the liquid film LF3 is dropped from a rear end of the substrate 100 is low. Thus, the outflow of the liquid film LF3 is gentle, thereby suppressing the droplet from remaining on the exposed surface 103.

As described above, the controller 4 changes the movement speed of the transfer holder 36, ultimately the substrate 100 according to the progress of the exposure. As described above, it is possible to suppress the droplet from remaining on the exposed surface 103. Furthermore, as described above, it is possible to shorten the time required for drying.

In addition, although the horizontal-direction driving part of the present embodiment moves the transfer holder 36, ultimately the substrate 100, it may move the first heat transfer part 61 and the second heat transfer part 71. In that case, the controller 4 may change the movement speeds of the first heat transfer part 61 and the second heat transfer part 71 according to the progress of the exposure.

The second transfer device 35 has a Z-axis-direction driving part 38 which moves the transfer holder 36 in the Z-axis direction. The Z-axis-direction driving part 38 is an example of a vertical-direction driving part for relatively moving the transfer holder 36 in the vertical direction relative to the first heat transfer part 61 and the second heat transfer part 71.

The controller 4 controls a Z-axis direction position of the transfer holder 36 so as to control a first interval W1 and a second interval W2 illustrated in FIG. 10. The first interval W1 is an interval between the substrate 100 and the first heat transfer part 61, and the second interval W2 is an interval between the substrate 100 and the second heat transfer part 71. When the first interval W1 and the second interval W2 are changed, heat transferability is changed. Thus, the temperature difference of the liquid film LF3, ultimately the surface tension difference of the liquid film LF3 can be controlled, thereby controlling the agglomeration of the liquid film LF3.

Furthermore, in the present embodiment, both the first interval W1 and the second interval W2 are changed at the same time because the substrate 100 is moved in the vertical direction. However, when the first heat transfer part 61 and the second heat transfer part 71 are independently moved in the vertical direction, the first interval W1 and the second interval W2 may also be independently changed.

The drying apparatus 34 may have the imaging part 82 configured to image the agglomeration of the liquid film LF3. The controller 4 processes an image captured by the imaging part 82 to determine a quality of the agglomeration. The quality of the agglomeration is determined based on, for example, whether or not the droplet remains on the exposed surface 103. When it is determined that the quality of the agglomeration is poor, the controller 4 changes, for example, at least one selected from the first temperature T1, the second temperature T2, the first speed V1, the second speed V2, the third speed V3, the fourth speed V4, the first interval W1, and the second interval W2, so as to improve the quality of the agglomeration.

Figure 20:
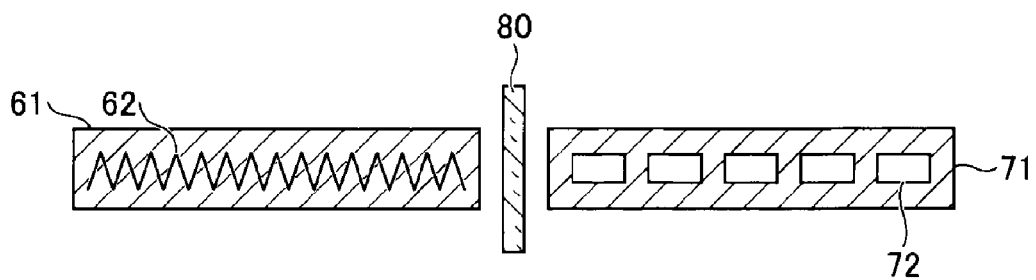
FIG. 20 is a cross-sectional view illustrating an example of a partition member arranged between a first heat transfer part and a second heat transfer part.

In addition, as illustrated in FIG. 20, the drying apparatus 34 may have a partition member 80 for inhibiting heat transfer between the first heat transfer part 61 and the second heat transfer part 71. The partition member 80 is formed in a plate shape and is made of, e.g., ceramics or the like. The temperature difference between the first temperature T1 and the second temperature T2 can be further increased by the partition member 80. As a result, it is possible to further increase the temperature difference of the liquid film LF3 and to further improve the agglomeration force of the liquid film LF3.

An upper surface of the partition member 80 may be arranged beyond upper surfaces of the first heat transfer part 61 and the second heat transfer part 71. Since the heat transfer between a space above the first heat transfer part 61 and a space above the second heat transfer part 71 can be inhibited, it is possible to further increase the temperature difference of the liquid film LF3 and to further improve the agglomeration force of the liquid film LF3.

A lower surface of the partition member 80 may be arranged beyond lower surfaces of the first heat transfer part 61 and the second heat transfer part 71. Since the heat transfer between the first heat transfer part 61 and the second heat transfer part 71 can be further inhibited, it is possible to further increase the temperature difference between the first temperature T1 and the second temperature T2. As a result, it is possible to further increase the temperature difference of the liquid film LF3 and to further improve the agglomeration force of the liquid film LF3.

The substrate 100 and the first heat transfer part 61 may be brought into contact with each other with no gap in order to promote the heat transfer between the substrate 100 and the first heat transfer part 61. Similarly, the substrate 100 and the second heat transfer part 71 may be brought into contact with each other with no gap in order to promote the heat transfer between the substrate 100 and the second heat transfer part 71.

Figure 11:
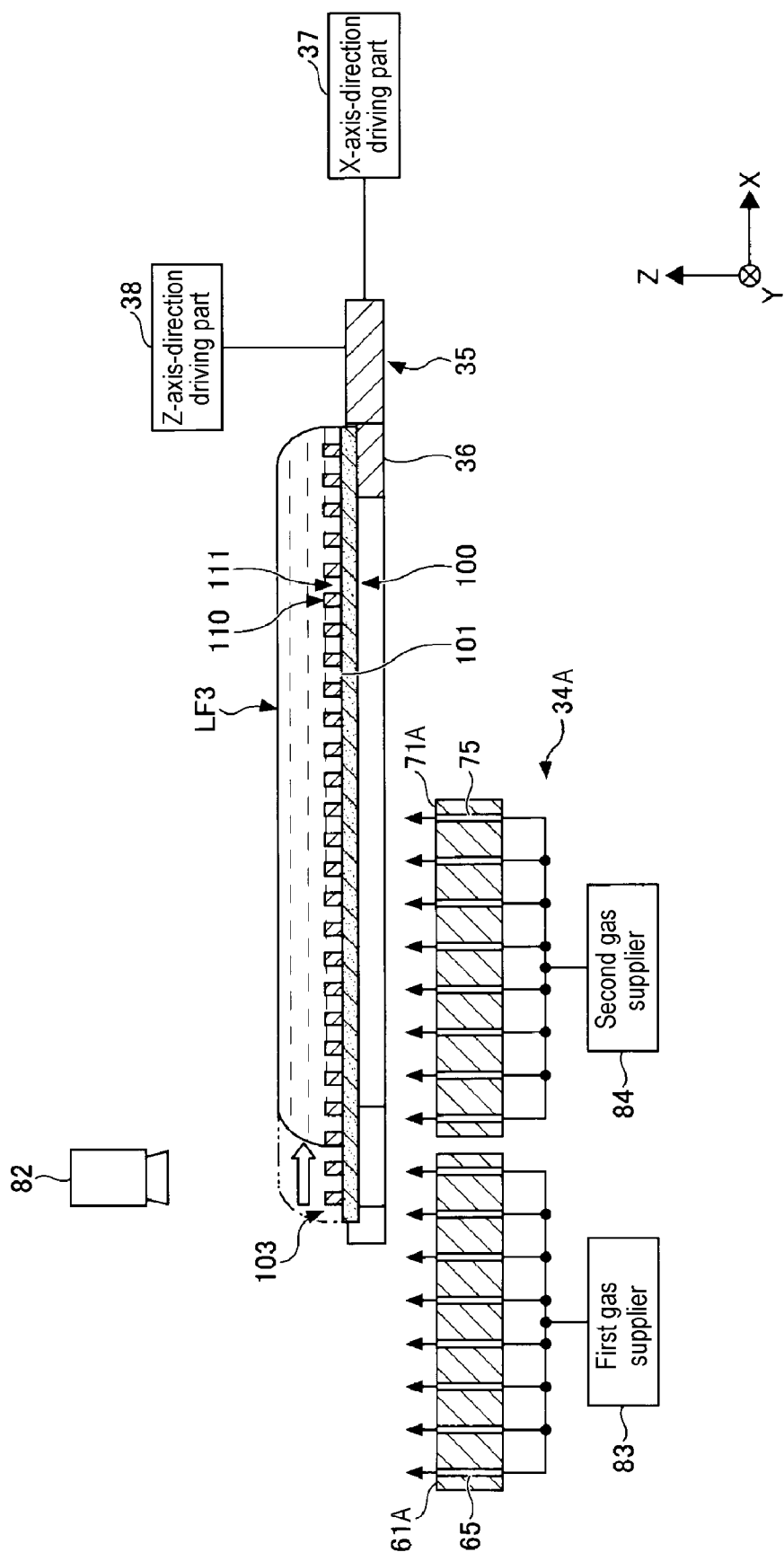
FIG. 11 is a cross-sectional view illustrating an exemplary modification of the drying apparatus.

FIG. 11 is a cross-sectional view illustrating an exemplary modification of the drying apparatus. Hereinafter, differences between a drying apparatus 34A of this modification and the drying apparatus 34 of the aforementioned embodiment will be mainly described. Even in this modification, the partition member 80 illustrated in FIG. 20 may be arranged between a first heat transfer part 61A and a second heat transfer part 71A. In this modification, the partition member 80 also serves to partition the flow of a gas. Also, in other exemplary modifications, the partition member 80 may be used.

The drying apparatus 34A of this modification has a first gas supplier 83 configured to supply a first gas to the first heat transfer part 61A. The first gas may be air, or an inert gas such as a nitrogen gas, an argon gas or the like. The first gas supplier 83 has a source of the first gas, a pipe extending from the source to the first heat transfer part 61A, an opening/closing valve installed in the pipe, and a flow rate controller installed in the pipe. When the opening/closing valve opens the pipe, the first gas is supplied from the source to the first heat transfer part 61. A supply flow rate of the first gas is controlled by the flow rate controller. On the other hand, when the opening/closing valve closes the pipe, the supply of the first gas from the source to the first heat transfer part 61A is stopped.

The first heat transfer part 61A has a flow passage 65 through which the first gas is injected toward the substrate 100. Since the temperature of the first gas is adjusted by the first heat transfer part 61A while passing through the flow passage 65, it is possible to promote the heat transfer between the first heat transfer part 61A and the substrate 100. In addition, in a case in which the substrate 100 is warped and thus the interval between the substrate 100 and the first heat transfer part 61A is varied, it is possible to reduce a variation in heat transferability due to the variation in the interval.

In the case in which the first heat transfer part 61A has the flow passage 65, the first heat transfer part 61A is arranged below the substrate 100. Since the first gas is brought into contact with the lower surface of the substrate 100 but not brought into contact with the upper surface 101 of the substrate 100, it is possible to suppress disturbance of the liquid film LF3.

The drying apparatus 34A of this modification has a second gas supplier 84 configured to supply a second gas to the second heat transfer part 71A. The second gas may be air, or an inert gas such as a nitrogen gas, an argon gas or the like. The second gas supplier 84 has a source of the second gas, a pipe extending from the source to the second heat transfer part 71A, an opening/closing valve installed in the pipe, and a flow rate controller installed in the pipe. When the opening/closing valve opens the pipe, the second gas is supplied from the source to the second heat transfer part 71A. A supply flow rate of the second gas is controlled by the flow rate controller. On the other hand, when the opening/closing valve closes the pipe, the supply of the second gas from the source to the second heat transfer part 71A is stopped.

The second heat transfer part 71A has a flow passage 75 through which the second gas is injected toward the substrate 100. Since the temperature of the second gas is adjusted by the second heat transfer part 71A while passing through the flow passage 75, it is possible to promote the heat transfer between the second heat transfer part 71A and the substrate 100. Furthermore, in a case in which the substrate 100 is warped and thus the interval between the substrate 100 and the second heat transfer part 71A is varied, it is possible to reduce a variation in heat transferability due to the variation in the interval.

In the case in which the second heat transfer part 71A has the flow passage 75, the second heat transfer part 71A is arranged below the substrate 100. Since the second gas is brought into contact with the lower surface of the substrate 100 but not brought into contact with the upper surface 101 of the substrate 100, it is possible to suppress disturbance of the liquid film LF3.

Figure 12:
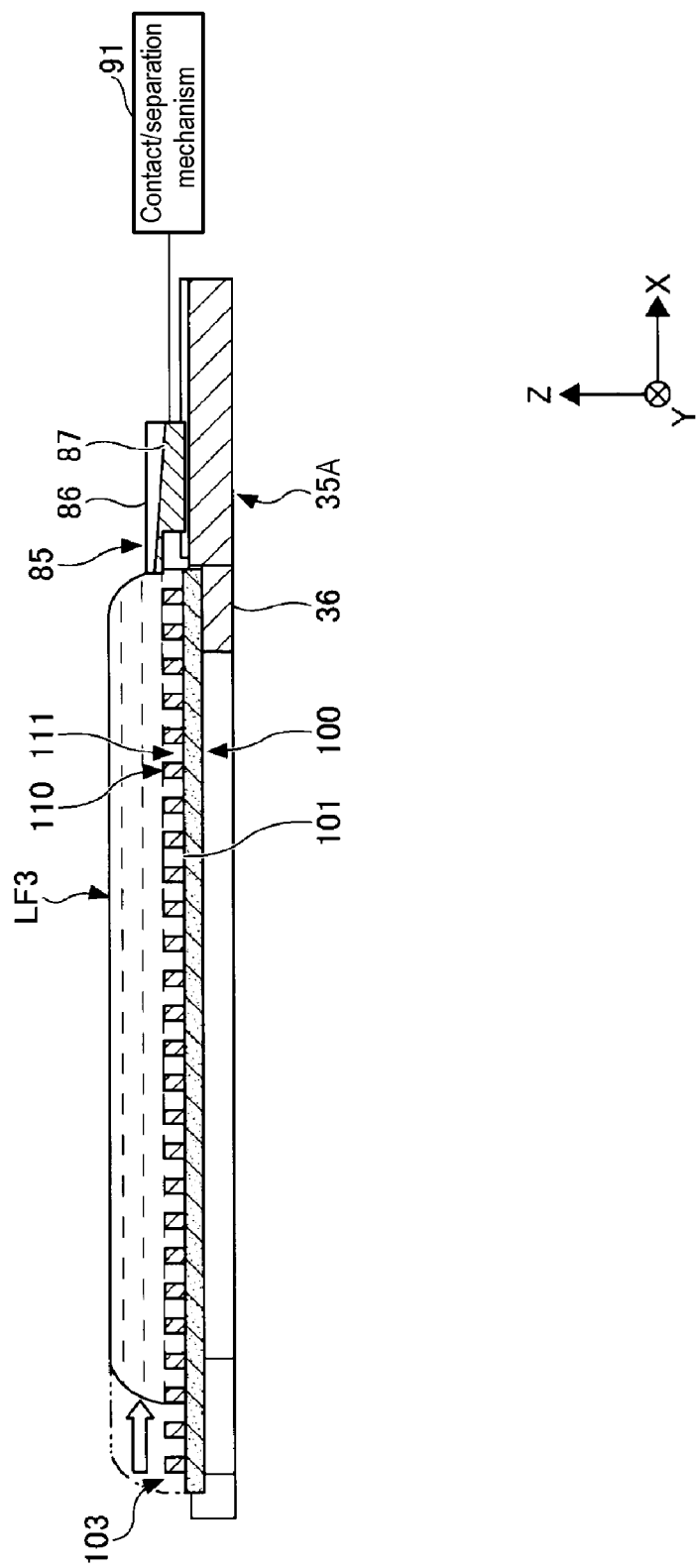
FIG. 12 is a cross-sectional view illustrating an exemplary modification of a second transfer device.
Figure 13:
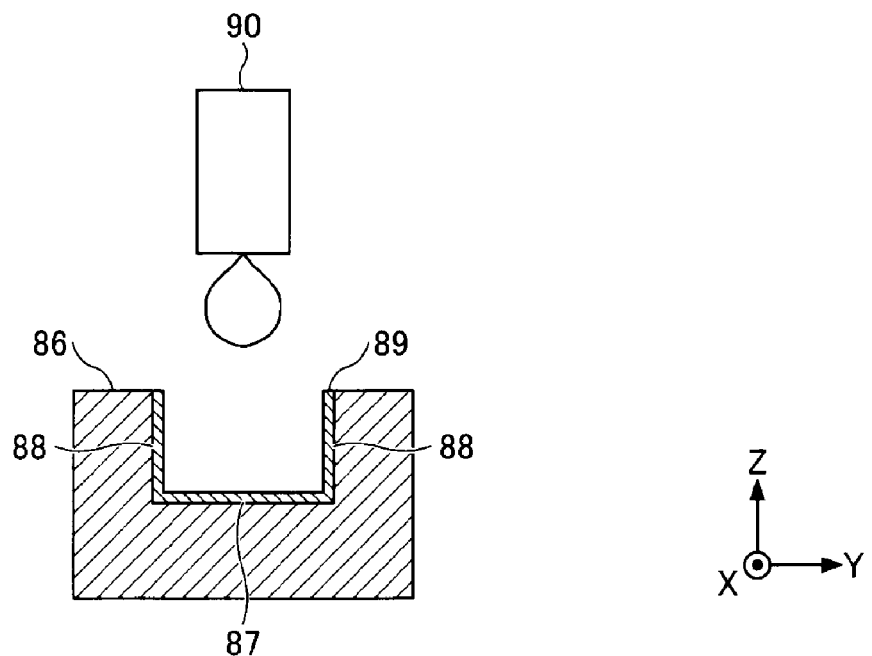
FIG. 13 is a cross-sectional view of a gutter illustrated in FIG. 12.

FIG. 12 is a cross-sectional view illustrating an exemplary modification of the second transfer device. FIG. 13 is a cross-sectional view of a gutter illustrated in FIG. 12. Hereinafter, differences between a second transfer device 35A of this modification and the second transfer device 35 of the aforementioned embodiment will be mainly described.

The second transfer device 35A of this modification has a liquid discharge mechanism 85. The liquid discharge mechanism 85 is brought into contact with the liquid film LF3 to discharge the liquid film LF3 outward of the substrate 100. The height of the liquid film LF3 can be suppressed from increasing as the liquid film LF3 is broken and thus the height of the liquid film LF3 can be kept constant. Thus, it is possible to stabilize the agglomeration of the liquid film LF3.

The liquid discharge mechanism 85 has, for example, a gutter 86. The gutter 86 is brought into contact with the liquid film LF3. The gutter 86 is brought into contact with the liquid film LF3 at a point where the enlargement of the exposed surface 103 ends. The liquid of the liquid film LF3 flows through the gutter 86 and is discharged outward of the substrate 100. As illustrated in FIG. 12, a lower bottom 87 of the gutter 86 may be inclined downward as it goes downstream. Thus, it is possible to promote the liquid discharge by gravity.

A hydrophilic surface-modified layer 89 may be formed at the lower bottom 87 and two sidewalls 88 of the gutter 86, as illustrated in FIG. 13. The surface-modified layer 89 is formed by modifying the surface of the gutter 86 made of resin by plasma processing. The liquid in the liquid film LF3 can be ejected into the gutter 86 by the surface-modified layer 89, thereby promoting the liquid discharge. Also, the gutter 86 itself may be made of a hydrophilic material.

The second transfer device 35A of this modification has a discharge nozzle 90 configured to supply the liquid into the gutter 86, as illustrated in FIG. 13. By wetting the inside of the gutter 86 with the liquid, the liquid in the liquid film LF3 can be drawn into the gutter 86, thereby promoting the liquid discharge.

As illustrated in FIG. 12, the second transfer device 35A of this modification has a contact/separation mechanism 91. The contact/separation mechanism 91 relatively moves the liquid discharge mechanism 85 relative to the substrate 100 to allow the liquid film LF3 and the liquid discharge mechanism 85 to bring into contact with and separate from each other. The contact/separation mechanism 91 moves the liquid discharge mechanism 85 in FIG. 12, but may move the substrate 100 alone or both the substrate 100 and the liquid discharge mechanism 85. The controller 4 controls the contact and separation between the liquid film LF3 and the liquid discharge mechanism 85 so as to control the liquid discharge amount.

FIG. 14 is a cross-sectional view illustrating an exemplary modification of the liquid discharge mechanism. As illustrated in FIG. 14, a liquid discharge mechanism 85A may have a suction nozzle 92 instead of the gutter 86. The suction nozzle 92 is brought into contact with the liquid film LF3. The suction nozzle 92 is formed in a cylindrical shape. The second transfer device 35A may have a suction mechanism 93 which suctions the liquid film LF3 via the liquid discharge mechanism 85A. The suction mechanism 93 is, for example, a suction pump or the like. The controller 4 can control a suction amount of the suction mechanism 93 so as to control the liquid discharge amount.

Figure 15A:
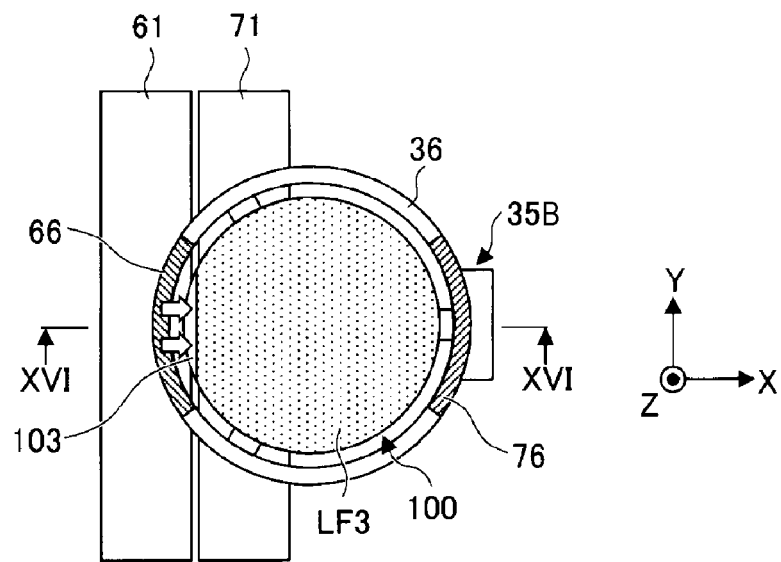
FIGS. 15A and 15B are plan views illustrating another exemplary modification of the second transfer device.
Figure 15B:
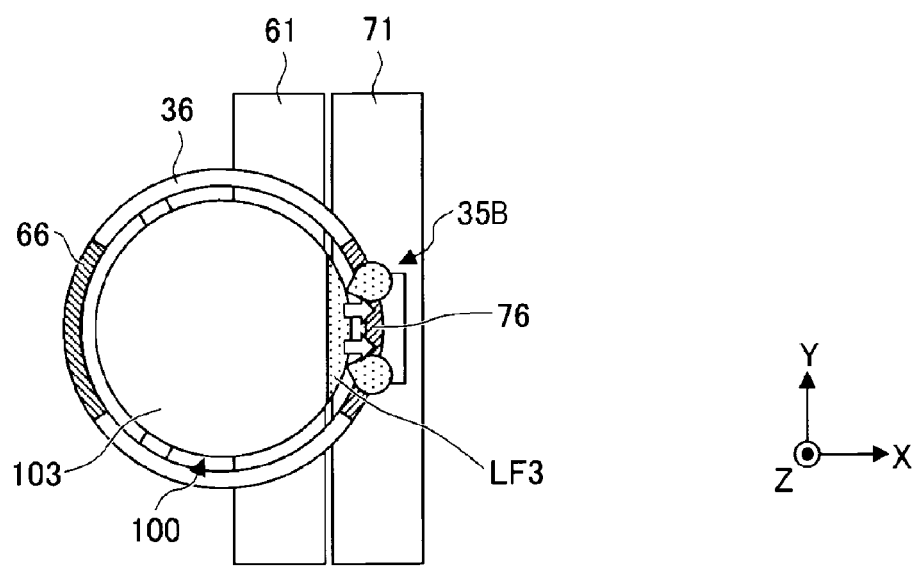
Figure 16:
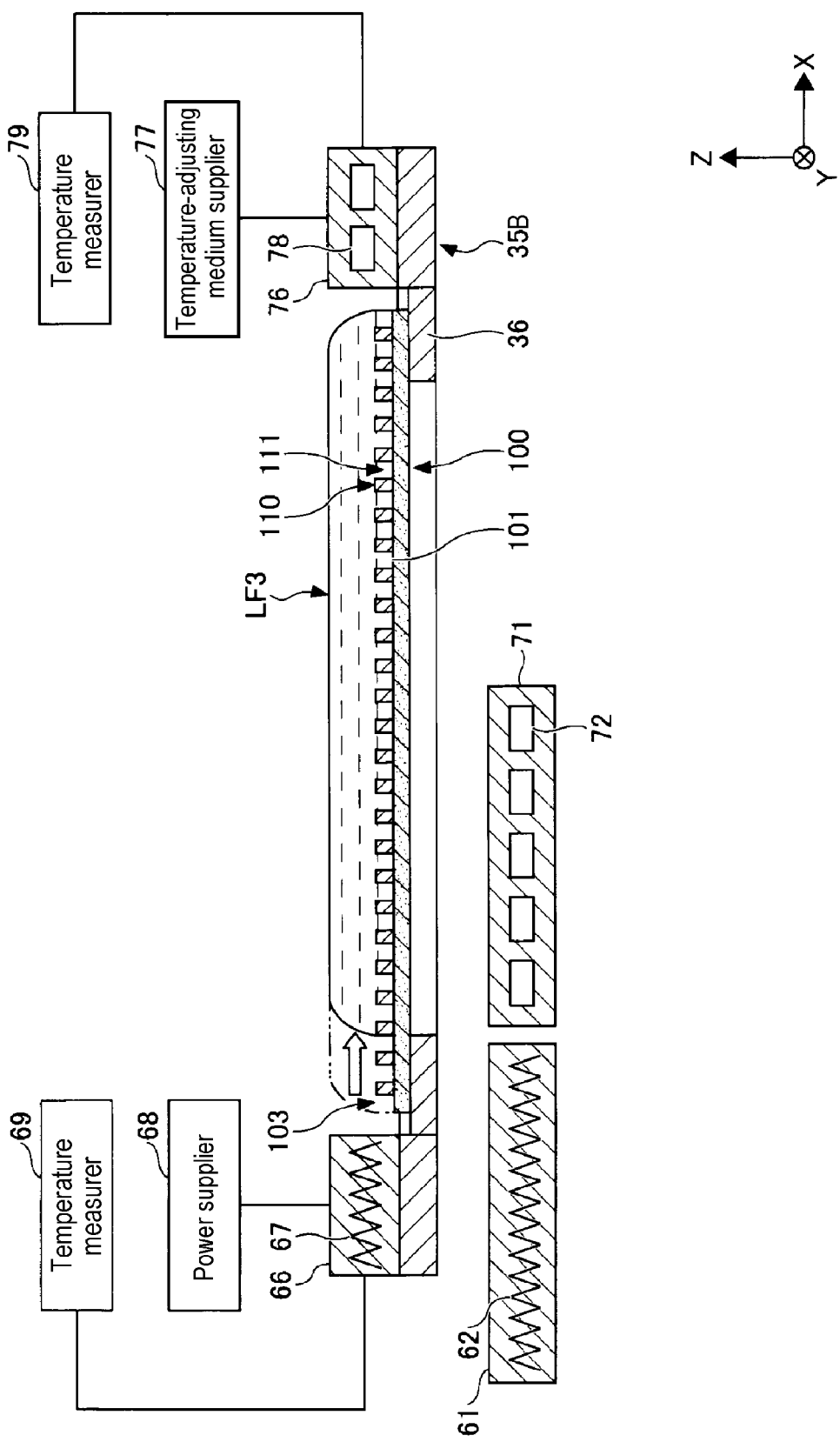
FIG. 16 is a cross-sectional view of the second transfer device illustrated in FIGS. 15A and 15B, and taken along line XVI-XVI in FIG. 15A.

FIGS. 15A and 15B are plan views illustrating another exemplary modification of the second transfer device, in which FIG. 15A is a plan view illustrating a second stage of the drying process, similarly to FIG. 9B, and FIG. 15B is a plan view illustrating a fifth stage of the drying process, similarly to FIG. 9E. In FIGS. 15A and 15B, the liquid film LF3 is represented by a dot pattern, a heating part 66 is represented by a right-downward diagonally shaded pattern, and a cooling part 76 is represented by a left-downward diagonally shaded pattern. FIG. 16 is a cross-sectional view of a second transfer device 35B illustrated in FIGS. 15A and 15B, and taken along line XVI-XVI in FIG. 15A. In FIGS. 15A and 15B, illustrations of a power supplier 68, a temperature-adjusting medium supplier 77 and the like shown in FIG. 16 are omitted. Hereinafter, differences between the second transfer device 35B of this modification and the second transfer devices 35 and 35A of the aforementioned embodiment and the like will be mainly described.

The second transfer device 35B of this modification has the heating part 66. The heating part 66 is arranged radially outward of the substrate 100 and applies heat to the start point of exposure. The heating part 66 is adjusted to the third temperature T3 higher than room temperature, and applies heat to the substrate 100 by a temperature difference. The heating part 66 is formed in, for example, a plate shape, and is horizontally arranged. The heating part 66 has, for example, an arc shape, in a plan view, and is fixed to the transfer holder 36.

The second transfer device 35B has a heater 67 for heating the heating part 66 and a power supplier 68 for supplying electric power to the heater 67. The heater 67 is buried in the heating part 66 in FIG. 16, but may be installed outside the heating part 66. The power supplier 68 includes a power source and a power regulator for regulating electric power supplied from the power source to the heater 67. The controller 4 controls the electric power to be supplied to the heater 67 so as to control the temperature of the heating part 66 to the third temperature T3. The second transfer device 35B may further have a temperature measurer 69 for measuring the temperature of the heating part 66. The controller 4 controls the electric power to be supplied to the heater 67 so that the measured value of the temperature measurer 69 becomes equal to the third temperature T3.

As illustrated in FIG. 15A, the front end of the substrate 100 passes through the boundary between the second heat transfer part 71 and the first heat transfer part 61 in a plan view. As a result, a temperature difference is generated in the liquid film LF3 to generate a surface tension difference, so that the exposed surface 103 is formed at the front end of the substrate 100 by a Marangoni force. At this time, since the heating part 66 heats the front end of the substrate 100, a sufficient temperature gradient can be generated at the front end of the substrate 100 to generate a sufficient surface tension difference at the time of starting the formation of the exposed surface 103.

The second transfer device 35B of this modification has the cooling part 76. The cooling part 76 is arranged radially outward of the substrate 100 and absorbs heat from the end point of the exposure. The cooling part 76 is adjusted to a fourth temperature T4 lower than room temperature to take heat from the substrate 100 by a temperature difference. The cooling part 76 is formed in, for example, a plate shape, and is horizontally arranged. The cooling part 76 has, for example, an arc shape, in a plan view, and is fixed to the transfer holder 36.

The second transfer device 35B has the temperature-adjusting medium supplier 77. The temperature-adjusting medium supplier 77 supplies a temperature-adjusting medium to a flow passage 78 in the cooling part 76. The temperature-adjusting medium supplier 77 includes, for example, a pump for forcibly feeding the temperature-adjusting medium and a temperature adjuster for adjusting a temperature of the temperature-adjusting medium. The controller 4 controls a flow rate of the temperature-adjusting medium and the temperature thereof so as to control the temperature of the cooling part 76 to the fourth temperature T4. The second transfer device 35B may further have a temperature measurer 79 for measuring the temperature of the cooling part 76. The controller 4 controls the flow rate and the temperature of the temperature-adjusting medium so that the measured value of the temperature measurer 79 becomes equal to the fourth temperature T4. The temperature of the temperature-adjusting medium is set lower than room temperature.

As illustrated in FIG. 15B, when the substrate 100 moves forward and the exposed surface 103 of the substrate 100 is further enlarged, the liquid film LF3 is dropped down from the rear end of the substrate 100. At this time, since the cooling part 76 takes heat from the rear end of the substrate 100, a sufficient temperature gradient can be generated at the rear end of the substrate 100 to generate a surface tension difference enough to outflow the liquid film LF3.

Figure 17A:
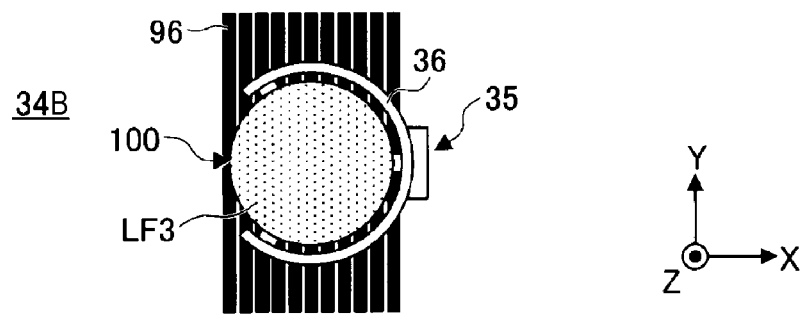
FIGS. 17A to 17E are plan views illustrating another exemplary modification of the drying apparatus.
Figure 17B:
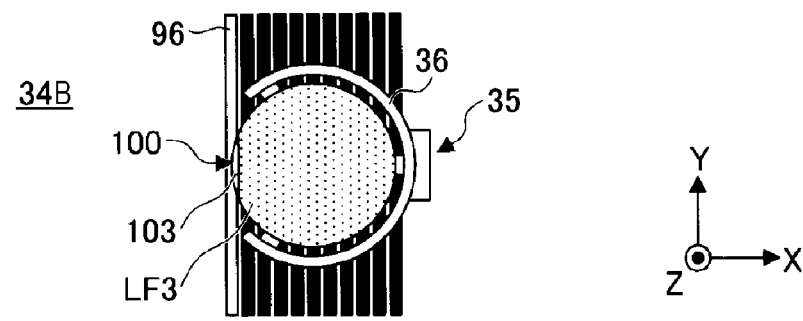
Figure 17C:
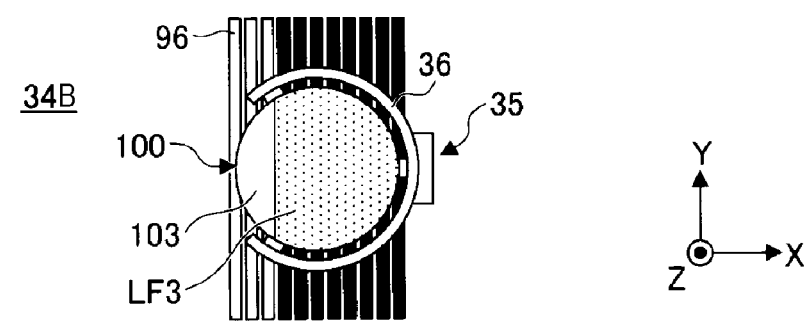
Figure 17D:
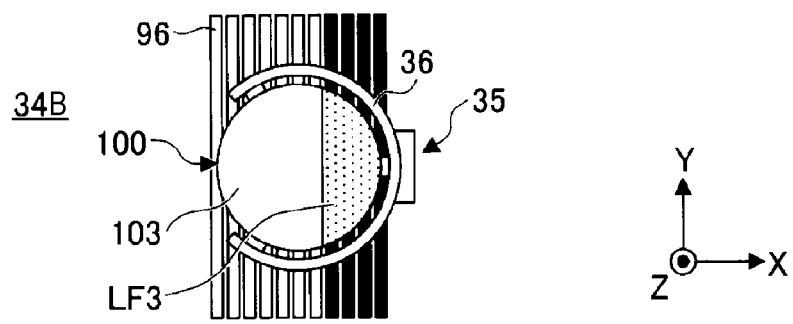
Figure 17E:
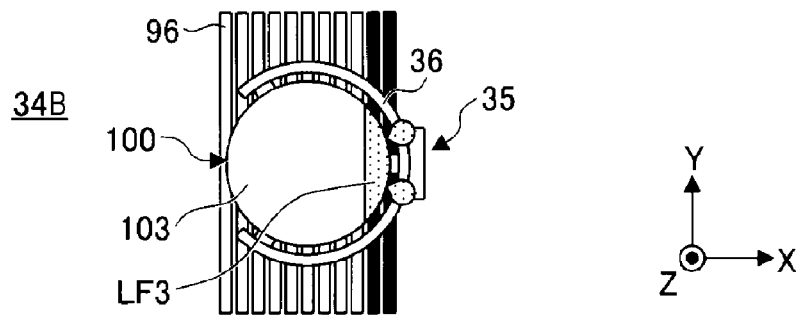

FIGS. 17A to 17E are plan views illustrating another exemplary modification of the drying apparatus, in which FIG. 17A is a plan view illustrating a first stage of the drying process, FIG. 17B is a plan view illustrating a second stage of the drying process following FIG. 17A, FIG. 17C is a plan view illustrating a third stage of the drying process following FIG. 17B, FIG. 17D is a plan view illustrating a fourth stage of the drying process following FIG. 17C, and FIG. 17E is a plan view illustrating a fifth stage of the drying process following FIG. 17D. In FIGS. 17A to 17E, the liquid film LF3 is represented by a dot pattern. Furthermore, in FIGS. 17A to 17E, the temperature of a white-colored heat transfer part 96 is a first temperature T1 and the temperature of a black-colored heat transfer part 96 is a second temperature T2 (where T2<T1). Hereinafter, differences between the drying apparatus 34B of this modification and the drying apparatus 34 of the aforementioned embodiment will be mainly described.

The drying apparatus 34B of this modification has a plurality of heat transfer parts 96. Each of the plurality of heat transfer parts 96 is formed in, for example, a plate shape, and horizontally arranged. The plurality of heat transfer parts 96 are arranged below the substrate 100 in FIGS. 17A to 17E, but may be arranged above the substrate 100. An air layer for transferring heat is formed between the plurality of heat transfer parts 96 and the substrate 100.

Each of the plurality of heat transfer parts 96 has, for example, a quadrangle shape, in a plan view. The quadrangle shape may include a rectangular shape in which the length of a pair of sides is different from the length of the remaining pair of sides, and a square shape in which the length of a pair of sides is equal to the length of the remaining pair of sides. The pair of sides are parallel to the X-axis direction, and the other pair of sides are parallel to the Y-axis direction. The dimension of the heat transfer parts 96 in a direction (for example, the Y-axis direction) orthogonal to a direction in which the exposed surface 103 is enlarged in a plan view (for example, the X-axis direction) is larger than the diameter of the substrate 100.

The plurality of heat transfer parts 96 are arranged in a direction in which the exposed surface 103 is enlarged in a plan view (for example, in the X-axis direction), and are arranged over a wider range than the diameter of the substrate 100. The temperature of each of the plurality of heat transfer parts 96 is switched between the first temperature T1 and the second temperature T2 (where T2<T1). For the switching, for example, a Peltier element is used. The Peltier element is formed by bonding two kinds of metals. When a DC current is allowed to flow through the bonded surface, heat is transferred between the metals. When the direction of the DC current is reversed, the direction of heat transfer is reversed. The controller 4 controls the direction and magnitude of the current applied to the Peltier element so as to switch the temperature of the heat transfer part 96 between the first temperature T1 and the second temperature T2. Each heat transfer part 96 of this modification serves as both the first heat transfer part 61 and the second heat transfer part 71 of the aforementioned embodiment.

First, as illustrated in FIG. 17A, the substrate 100 overlaps with the plurality of heat transfer parts 96 in a plan view, and all of the plurality of heat transfer parts 96 are adjusted to the second temperature T2. As described above, the plurality of heat transfer parts 96 are arranged in the direction in which the exposed surface 103 is enlarged in a plan view (for example, in the X-axis direction), and are arranged over a wider range than the diameter of the substrate 100. Therefore, since the temperature of the substrate 100 is uniform as a whole and the temperature of the liquid film LF3 is also uniform as a whole, the agglomeration of the liquid film LF3 is not generated.

Subsequently, as illustrated in FIGS. 17B to 17E, the temperatures of the plurality of heat transfer parts 96 are sequentially switched from the second temperature T2 to the first temperature T1, from one side (negative side in the X-axis direction) to the opposite side (positive side in the X-axis direction). As a result, a temperature difference is generated in the liquid film LF3 to generate a surface tension difference, so that the exposed surface 103 can be enlarged by a Marangoni force. The switching speed is determined so that no droplet remains on the exposed surface 103. For example, the switching speed may be determined to be small at the initial stage, large in the middle stage, and small at the final stage.

As described above, the plurality of heat transfer parts 96 of this modification are arranged in the direction in which the exposed surface 103 is enlarged in a plan view (for example, in the X-axis direction), and are arranged over a wider range than the diameter of the substrate 100. The temperature of each of the plurality of heat transfer parts 96 is switched between the first temperature T1 and the second temperature T2 (where T2<T1). In this case, the exposed surface 103 can be enlarged without relatively moving the heat transfer parts 96 and the substrate 100 in the horizontal direction.

Figure 18:
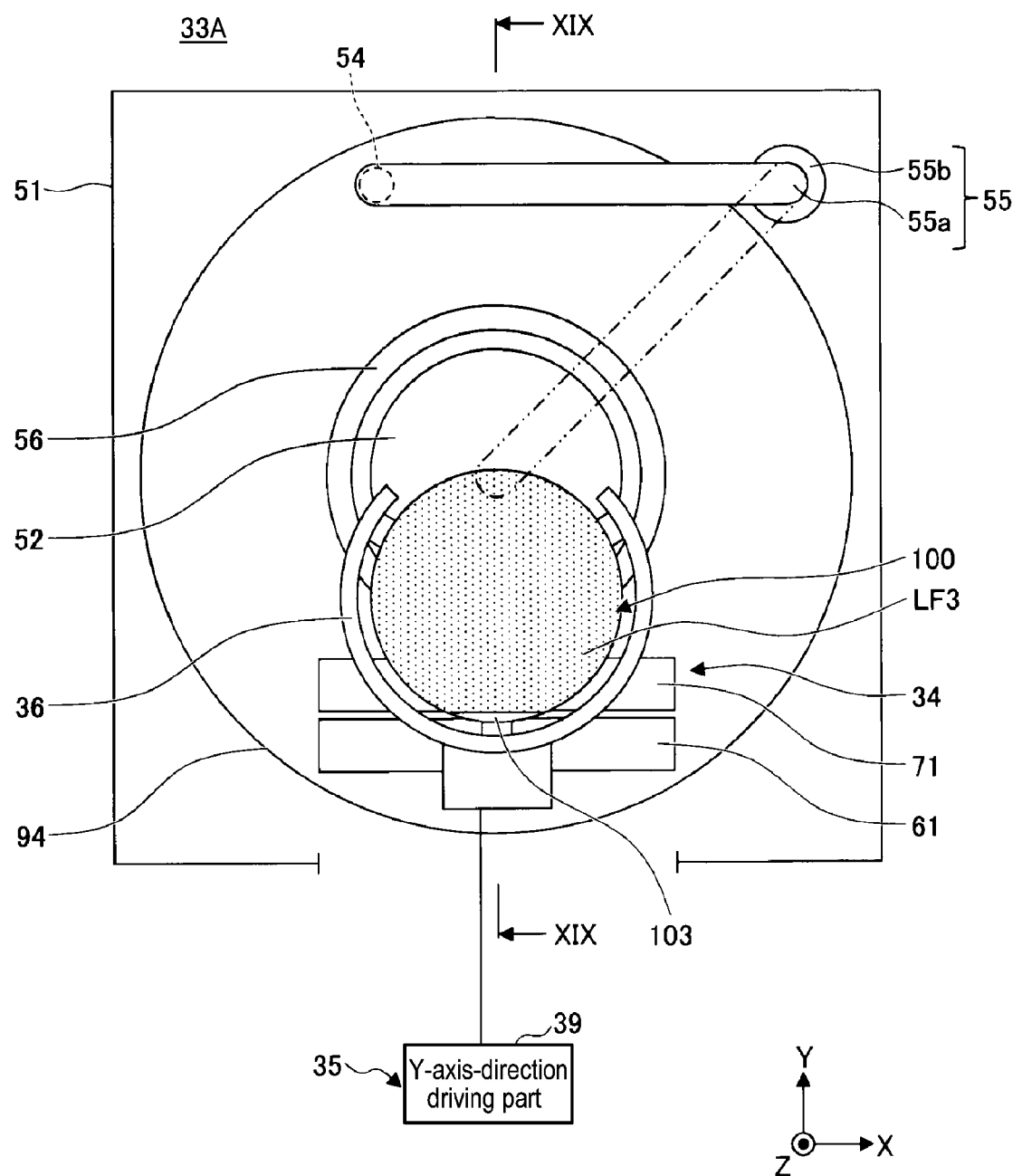
FIG. 18 is a plan view illustrating an exemplary modification of the liquid processing apparatus.
Figure 19:
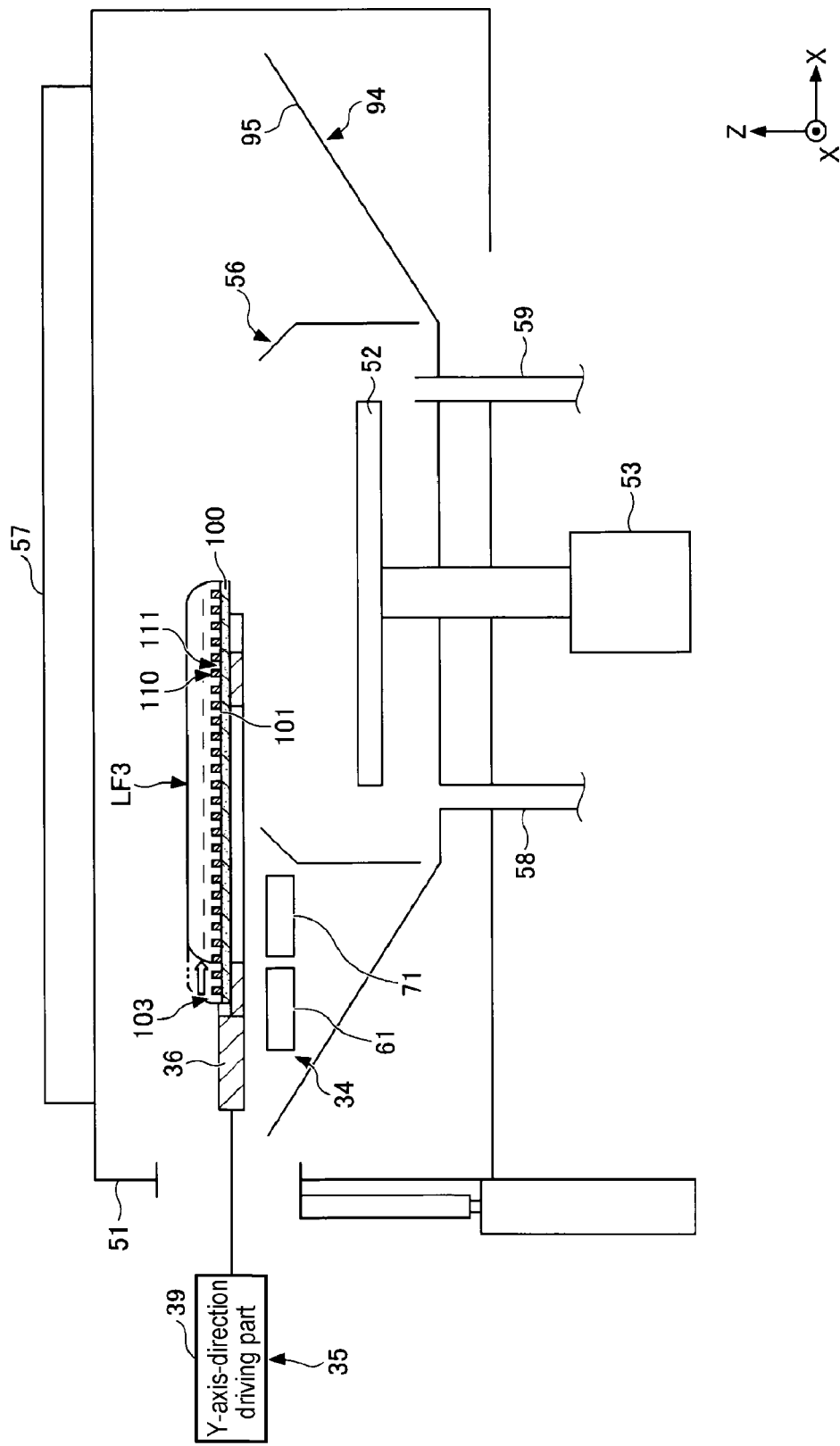
FIG. 19 is a cross-sectional view of the liquid processing apparatus illustrated in FIG. 18 and taken along line XIX-XIX in FIG. 18.

FIG. 18 is a plan view illustrating an exemplary modification of the liquid processing apparatus. FIG. 19 is a cross-sectional view of the liquid processing apparatus illustrated in FIG. 18 and taken along line XIX-XIX in FIG. 18. Hereinafter, differences between a liquid processing apparatus 33A of this modification and the liquid processing apparatus 33 of the aforementioned embodiment will be mainly described.

A drying apparatus 34 is installed in the liquid processing apparatus 33A of this modification. The formation of the liquid film LF1 of the chemical liquid L1 (step S2), the formation of the liquid film LF2 of the rinsing liquid L2 (step S3) and the formation of the liquid film LF3 of the drying liquid L3 (step S4), as well as the drying process of the substrate 100 (step S5), can be performed in a process vessel 51. Since the substrate 100 is not unloaded outward of the liquid processing apparatus 33 in a state in which the liquid film LF3 is formed, it is possible to suppress natural drying of the liquid film LF3 and to suppress the mixing of foreign substances into the liquid film LF3.

The drying apparatus 34 includes a first heat transfer part 61 and a second heat transfer part 71. The first heat transfer part 61 and the second heat transfer part 71 are arranged inside an extension cup 94 in a plan view, as illustrated in FIG. 18. The extension cup 94 receives a liquid dropped from the substrate 100 by the drying apparatus 34 and allows the liquid to flow into the cup 56. As illustrated in FIG. 19, the extension cup 94 has an inclined surface 95 inclined downward as it goes radially inward. The inclined surface 95 receives the dropped liquid and allows the same to flow therethrough. The received liquid is discharged from the bottom of the cup 56 to the liquid drain pipe 58. Both the liquid dropped from the substrate 100 by the drying apparatus 34 and the liquid collected in the cup 56 during the formation of the liquid film LF3 can be discharged from the same liquid drain pipe 58, thereby promoting commonization of the components. Also, a portion of the liquid dropped from the substrate 100 by the drying apparatus 34 may be directly collected in the cup 56 without passing through the extension cup 94.

The second transfer device 35 has a Y-axis-direction driving part 39 configured to move the transfer holder 36 in the Y-axis direction. The Y-axis-direction driving part 39 is an example of a horizontal-direction driving part for relatively moving the transfer holder 36 in the horizontal direction relative to the first heat transfer part 61 and the second heat transfer part 71. The Y-axis-direction driving part 39 moves the transfer holder 36 in the Y-axis direction so that the substrate 100 sequentially passes through the second heat transfer part 71 and the first heat transfer part 61 and reaches the outside of the process vessel 51 in a plan view.

The second temperature T2 is lower than the first temperature T1. The second heat transfer part 71 and the first heat transfer part 61 are sequentially arranged side by side in a direction in which the substrate 100 is unloaded from the liquid processing apparatus 33A. Therefore, the substrate 100 can be dried in the process of unloading the substrate 100 from the liquid processing apparatus 33A by the second transfer device 35. Since the transfer of the substrate 100 and the drying of the substrate 100 are simultaneously performed, multiple processes can be simultaneously performed, thereby shortening the processing time.

Although the embodiment of the substrate processing apparatus and the substrate processing method according to the present disclosure has been described above, the present disclosure is not limited to the aforementioned embodiment and the like. Various changes, modifications, substitutions, additions, deletions, and combinations, which naturally belong to the technical scope of the present disclosure, are possible within the scope of the accompanying claims.

For example, the substrate 100 has a disc shape in the aforementioned embodiment, but may have a rectangular plate shape. The shape of the substrate 100 is not particularly limited.

The substrate 100 is a semiconductor substrate in the aforementioned embodiment, but may be a glass substrate. The material of the substrate 100 is not particularly limited.

The installation place of the drying apparatus 34 is not limited to the inside of the delivery part 31 or the inside of the liquid processing apparatus 33. For example, the drying apparatus 34 may be installed outside the delivery part 31 and outside the liquid processing apparatus 33, or may be installed adjacent to the second transfer part 32, similarly to the liquid processing apparatus 33. Also in this case, similar to the case where the drying apparatus 34 is arranged inside the delivery part 31, the second heat transfer part 71 and the first heat transfer part 61 may be sequentially arranged side by side in a direction in which the substrate 100 is loaded into the drying apparatus 34. As a result, the substrate 100 can be dried in the process of loading the substrate 100 into the drying apparatus 34 by the second transfer device 35. Since the transfer of the substrate 100 and the drying of the substrate 100 are simultaneously performed, multiple processes can be simultaneously performed, thereby shortening the processing time.

The device for heating the first heat transfer part 61 is not limited to the heater, the temperature-adjusting medium supplier, or the Peltier element. For example, the first heat transfer part 61 may be heated by a laser beam. This holds true in the device for heating the second heat transfer part 71 and the device for heating the heating part 66.

The device for cooling the second heat transfer part 71 is not limited to the temperature-adjusting medium supplier, and may be, for example, the Peltier element. This holds true in the device for cooling the cooling part 76.

The drying process illustrated in FIG. 8 is performed using the transfer holder 36 of the second transfer device 35, but may be performed using the holder (for example, the transfer holder 81) of the drying apparatus 34. In this case, the holder of the drying apparatus 34 may be moved, or the first heat transfer part 61 and the second heat transfer part 71 may be moved. Furthermore, in a case in which the heat transfer parts 96 serving as both the first heat transfer part 61 and the second heat transfer part 71 is used, neither the heat transfer parts 96 nor the holder of the drying apparatus 34 need be moved.

According to the present disclosure in some embodiments, it is possible to suppress pattern collapse of an uneven pattern at the time of drying a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A drying apparatus for drying a substrate having an upper surface covered with a liquid film, comprising:
    a holder configured to horizontally hold the substrate;
    a first heat transfer part, whose temperature is adjusted to a first temperature, configured to heat the substrate, wherein a first heat is transferred between the first heat transfer part and the substrate by a first temperature difference;
    a second heat transfer part, whose temperature is adjusted to a second temperature lower than the first temperature and lower than room temperature, configured to cool the substrate, wherein a second heat is transferred between the second heat transfer part and the substrate by a second temperature difference and wherein the second heat transfer part and the first heat transfer part are sequentially arranged side by side in a horizontal direction such that a boundary between the second heat transfer par and the first transfer part in a plan view is extended in a direction perpendicular to the horizontal direction, wherein the second heat transfer part is a cooling plate configured to have a temperature lower than room temperature;
    a horizontal-direction driving part configured to move the holder in the horizontal direction relative to the first heat transfer part and the second heat transfer part so that the substrate sequentially passes through the second heat transfer part and the first heat transfer part in the plan view; and a controller configured to control the first temperature and the second temperature and to control a surface tension distribution of the liquid film so as to control an agglomeration of the liquid film.

2. The apparatus of claim 1, wherein the first heat transfer part has a flow passage through which a first gas injected toward the substrate passes, and wherein the apparatus od claim 1 further comprises a first gas supplier configured to supply the first gas to the first heat transfer part.

3. The apparatus of claim 1, further comprising: a liquid discharge mechanism brought into contact with the liquid film and configured to discharge the liquid film outward of the substrate.

4. The apparatus of claim 3, further comprising: a contact/separation mechanism configured to move the liquid discharge mechanism relative to the substrate so as to bring the liquid film into contact with the liquid discharge mechanism and separate the liquid film from the liquid discharge mechanism.

5. The apparatus of claim 3, further comprising: a suction mechanism configured to suck the liquid film through the liquid discharge mechanism.

6. The apparatus of claim 1, further comprising: a heating part arranged radially outward of the substrate and configured to apply the first heat to a start point of exposure due to the agglomeration.

7. The apparatus of claim 1, further comprising: a cooling part arranged radially outward of the substrate and configured to absorb the first heat from an end point of exposure due to the agglomeration.

8. The apparatus of claim 1, further comprising: a partition member configured to inhibit the first heat and the second heat from being transferred between the first heat transfer part and the second heat transfer part, respectively.

9. The apparatus of claim 1, wherein the controller is configured to:

set a movement speed at which the holder is moved in the horizontal direction relative to the first heat transfer part and the second heat transfer part from a first speed to a second speed before an end of the substrate passes through the boundary between the second heat transfer part and the first heat transfer part, wherein the first speed is higher than the second speed; and set the movement speed from the second speed to a third speed while the substrate passes through the first heat transfer part until the liquid film is dropped from the substrate, wherein the second speed is lower than the third speed.

10. The apparatus of claim 1, further comprising: a vertical-direction driving part configured to move the holder in a vertical direction relative to the first heat transfer part and the second heat transfer part.

11. A substrate processing system, comprising:

the drying apparatus of claim 1;

a liquid processing apparatus configured to form the liquid film;

a placement part on which a carrier accommodating the substrate is placed;

a first transfer device configured to transfer the substrate to the placement part and a delivery part; and a second transfer device configured to transfer the substrate to the delivery part and the liquid processing apparatus.

12. The system of claim 11, wherein the drying apparatus is installed inside the delivery part.

13. The system of claim 12, wherein the drying apparatus is provided in plural numbers, and the plurality of drying apparatuses are stacked one above another in a vertical direction.

14. The system of claim 11, wherein the drying apparatus is installed outside the delivery part and outside the liquid processing apparatus.

15. The system of claim 11, wherein the drying apparatus is installed inside the liquid processing apparatus.

16. The system of claim 15, wherein the second temperature is lower than the first temperature, and the second heat transfer part and the first heat transfer part are sequentially arranged side by side in a direction in which the substrate is unloaded from the liquid processing apparatus.

17. A drying method of covering an upper surface of a substrate having an uneven pattern formed thereon with a liquid film and subsequently drying the substrate, the method comprising:

Providing the drying apparatus of claim 1;

allowing the first heat to be transferred between the first heat transfer part whose temperature is adjusted to the first temperature and the substrate by the first temperature difference;

allowing the second heat to be transferred between the second heat transfer part whose temperature is adjusted to the second temperature and the substrate by the second temperature difference; and controlling the first temperature and the second temperature and controlling the surface tension distribution of the liquid film so as to control the agglomeration of the liquid film.

* * * * *